(12) United States Patent
Sasaki et al.

(10) Patent No.: US 9,484,612 B2
(45) Date of Patent: Nov. 1, 2016

(54) HIGH-FREQUENCY SIGNAL LINE AND ELECTRONIC DEVICE INCLUDING THE SAME

(71) Applicant: Murata Manufacturing Co., Ltd., Nagaokakyo-shi, Kyoto-fu (JP)

(72) Inventors: Satoshi Sasaki, Nagaokakyo (JP); Yuki Wakabayashi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 240 days.

(21) Appl. No.: 14/532,126

(22) Filed: Nov. 4, 2014

(65) Prior Publication Data

US 2015/0054600 A1    Feb. 26, 2015

Related U.S. Application Data

(63) Continuation of application No. PCT/JP2013/079977, filed on Nov. 6, 2013.

(30) Foreign Application Priority Data

Nov. 29, 2012    (JP) .................. 2012-260982

(51) Int. Cl.
*H01P 3/08*    (2006.01)
*H05K 1/02*    (2006.01)
*H05K 1/14*    (2006.01)

(52) U.S. Cl.
CPC ............... *H01P 3/082* (2013.01); *H01P 3/085* (2013.01); *H05K 1/0253* (2013.01); *H01P 3/088* (2013.01); *H05K 1/028* (2013.01); *H05K 1/0225* (2013.01); *H05K 1/147* (2013.01); *H05K 2201/09263* (2013.01); *H05K 2201/09618* (2013.01); *H05K 2201/09727* (2013.01)

(58) Field of Classification Search
CPC .......... H01P 3/08; H01P 3/081; H01P 3/082; H01P 3/085
USPC .................................................. 333/238, 246
See application file for complete search history.

(56) References Cited

U.S. PATENT DOCUMENTS

2012/0274423 A1    11/2012    Kato
2013/0127560 A1    5/2013    Kato et al.

FOREIGN PATENT DOCUMENTS

| JP | 04-317202 A | 11/1992 |
|----|-------------|---------|
| WO | 2012/074100 A1 | 6/2012 |
| WO | 2012073591 A1 | 6/2012 |

OTHER PUBLICATIONS

Official Communication issued in International Patent Application No. PCT/JP2013/079977, mailed on Feb. 4, 2014.

*Primary Examiner* — Stephen E Jones
(74) *Attorney, Agent, or Firm* — Keating & Bennett, LLP

(57) ABSTRACT

A high-frequency signal line includes a dielectric body including flexible dielectric sheets laminated in a direction of lamination and also including a first line portion, a second line portion extending along the first line portion, and a third line portion connecting ends in a specified direction of the first and second line portions. In the dielectric body, a signal line extends through the first, second and third line portions, and a first ground conductor and a second ground conductor face the signal line from both sides in the direction of lamination. One or more interlayer connection conductors are pierced in the dielectric sheets to connect the first ground conductor and the second ground conductor. None of the interlayer connection conductors is provided in a portion of the third line portion that is farther in a direction opposite to the specified direction than the signal line when viewed from the direction of lamination.

20 Claims, 27 Drawing Sheets

FIG. 2
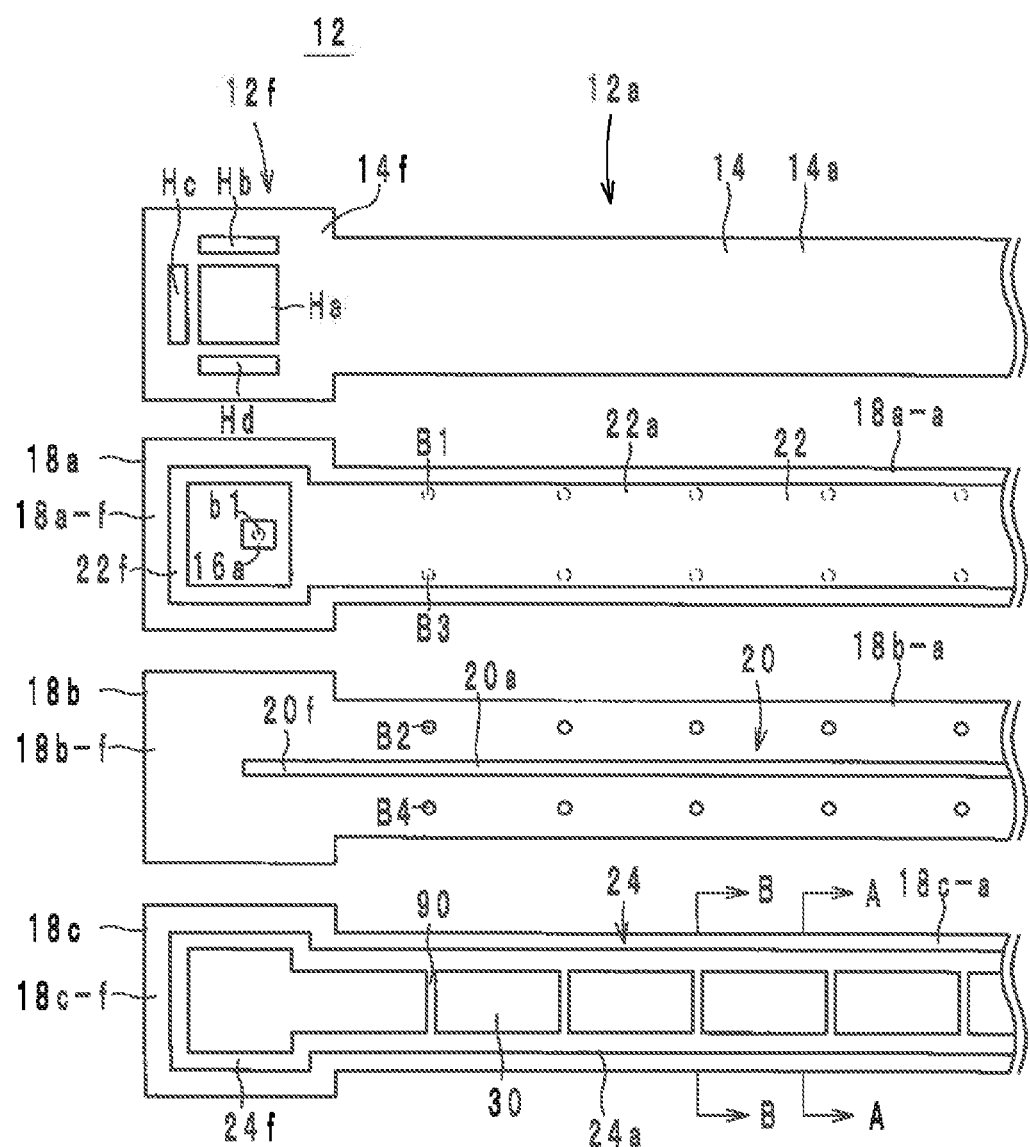

F I G. 7
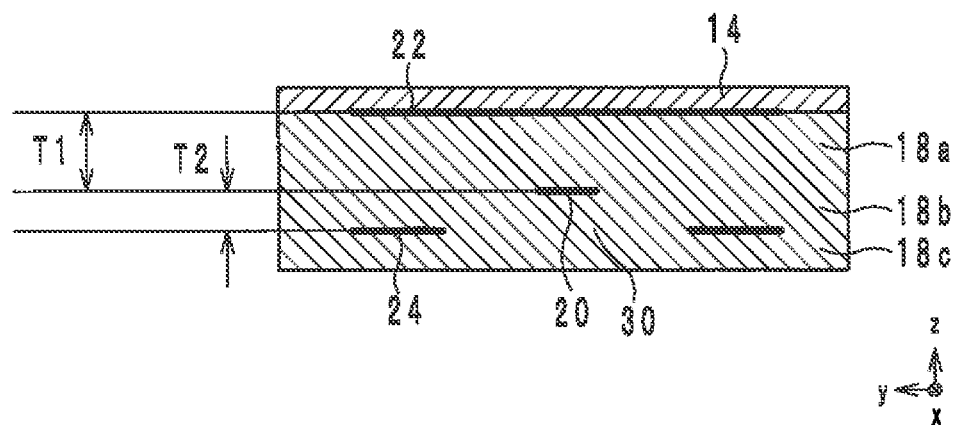
F I G. 8
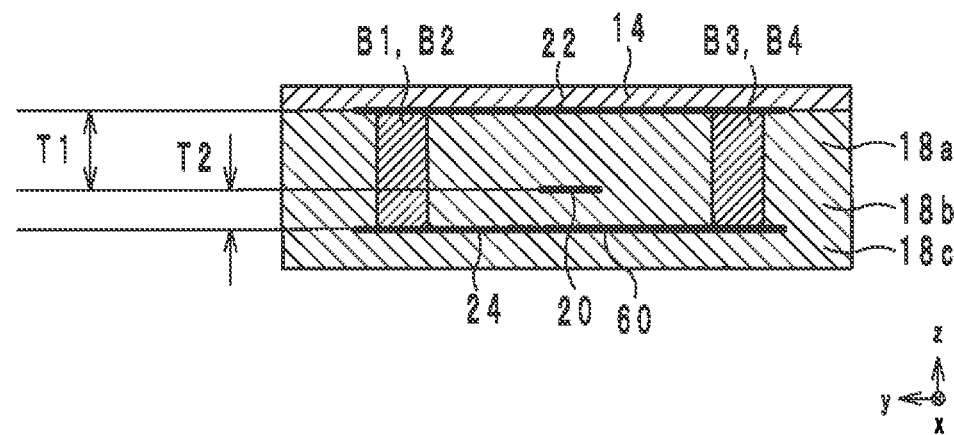

F I G. 1 4
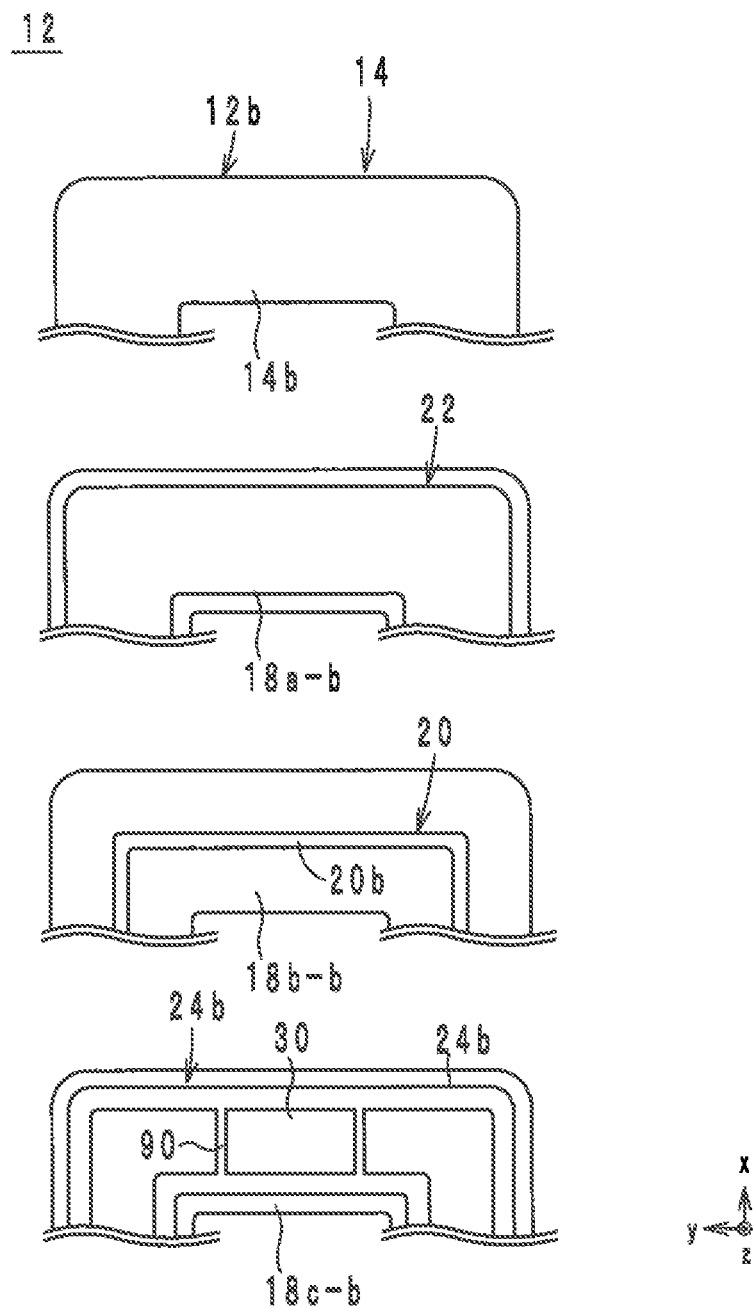

F I G. 18
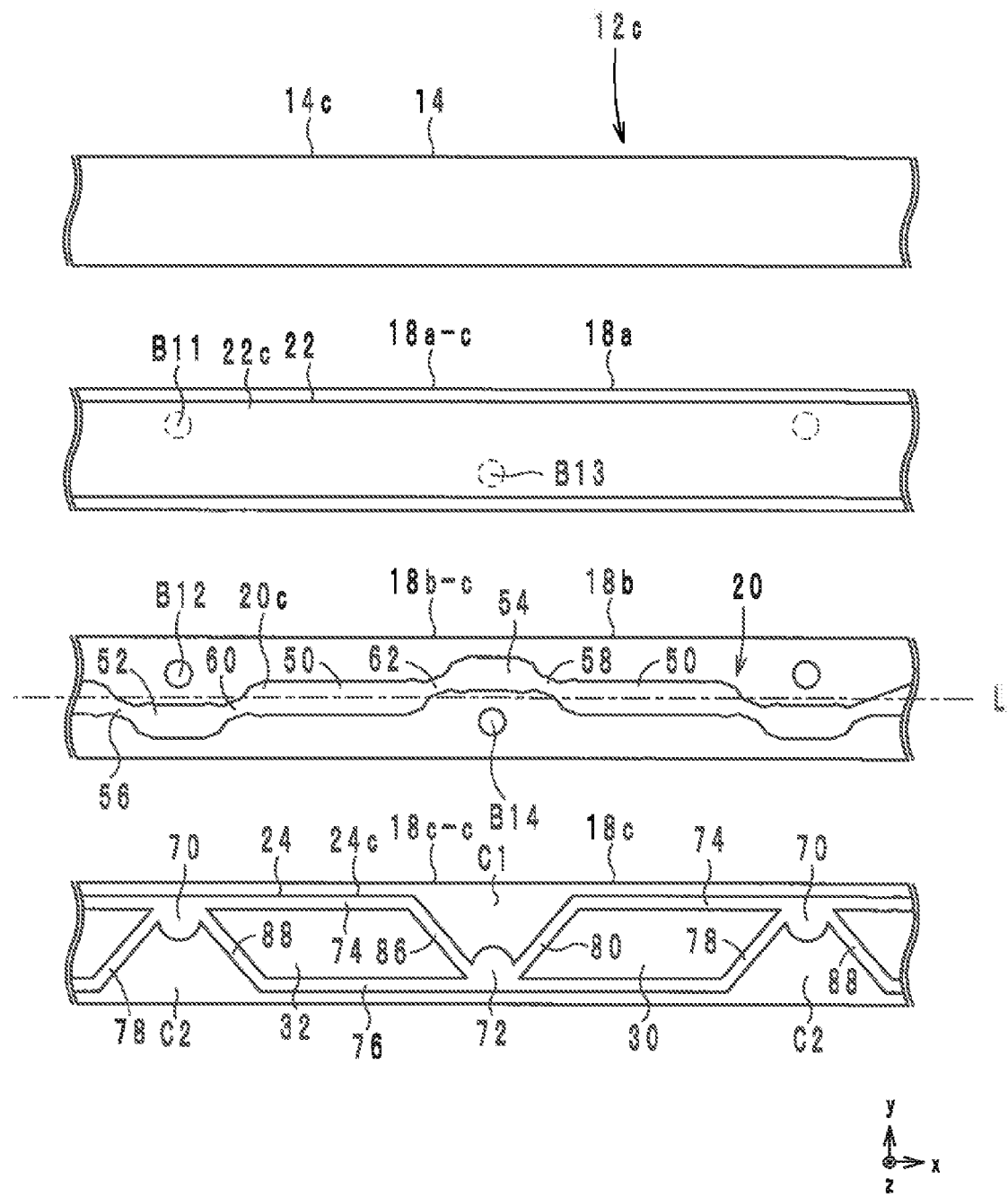

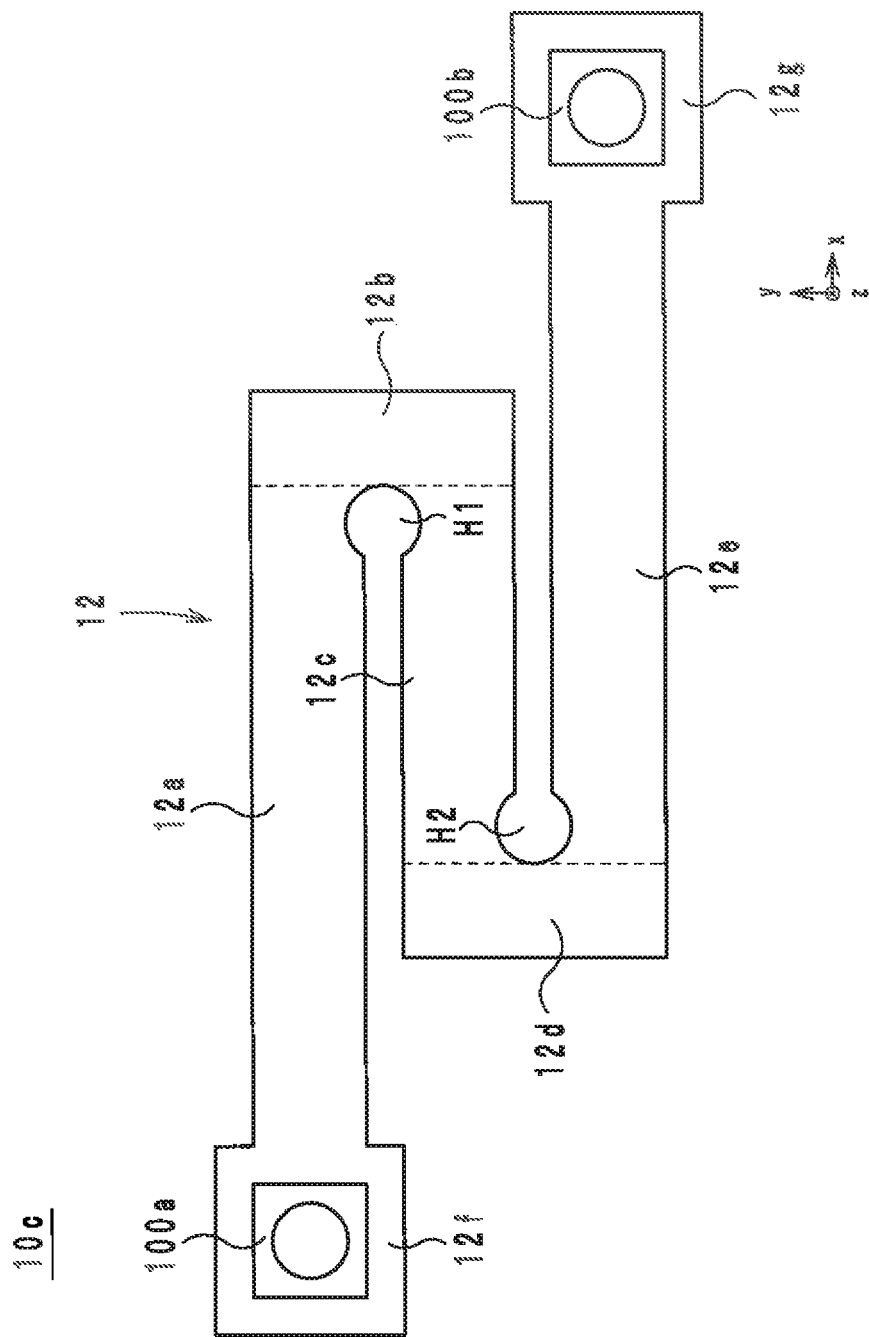

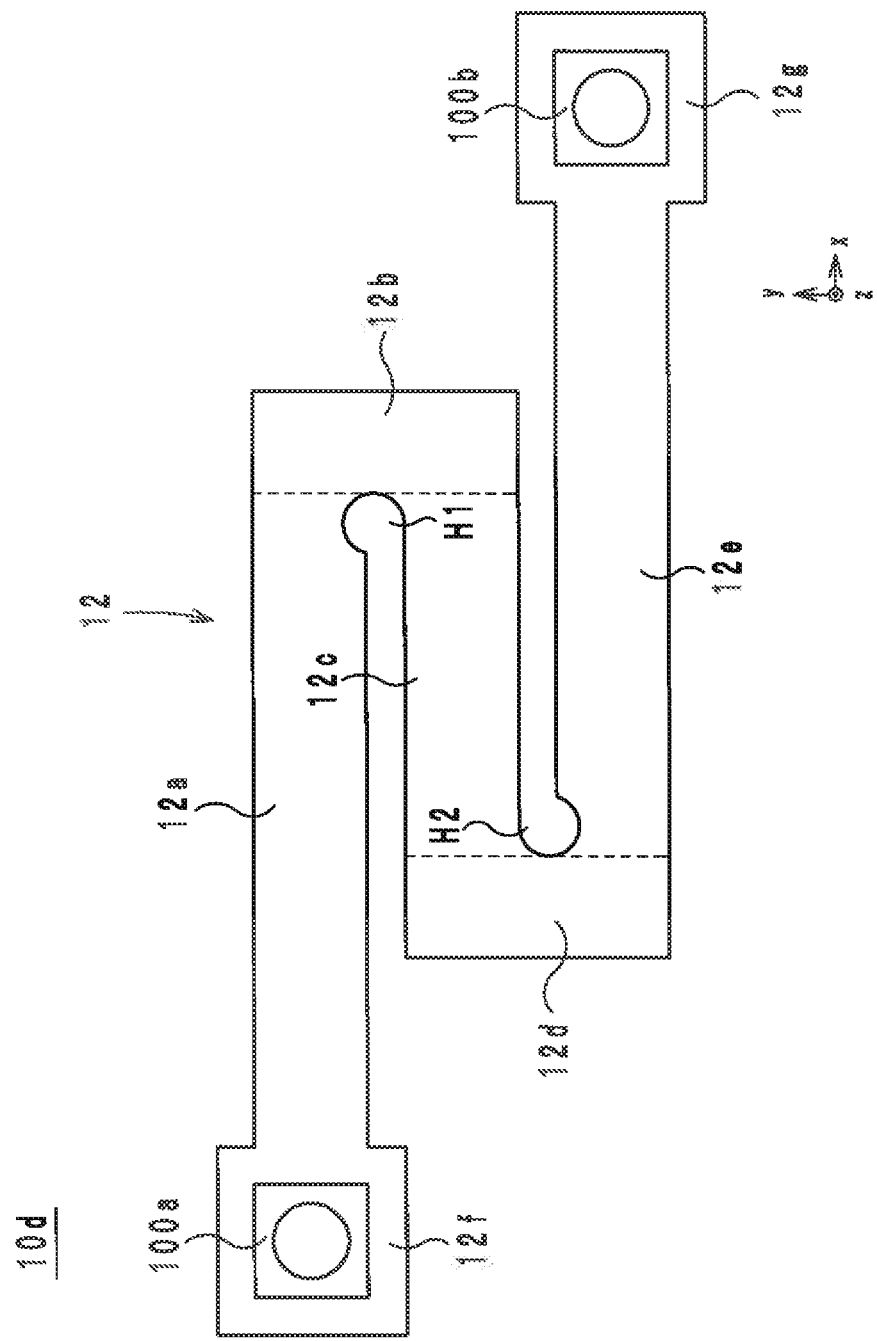

F I G . 2 3
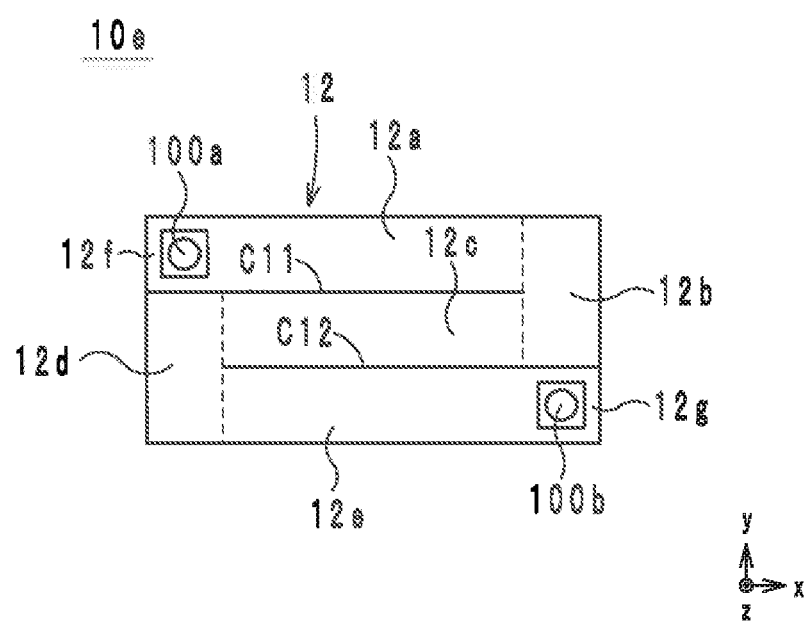

F I G . 2 5
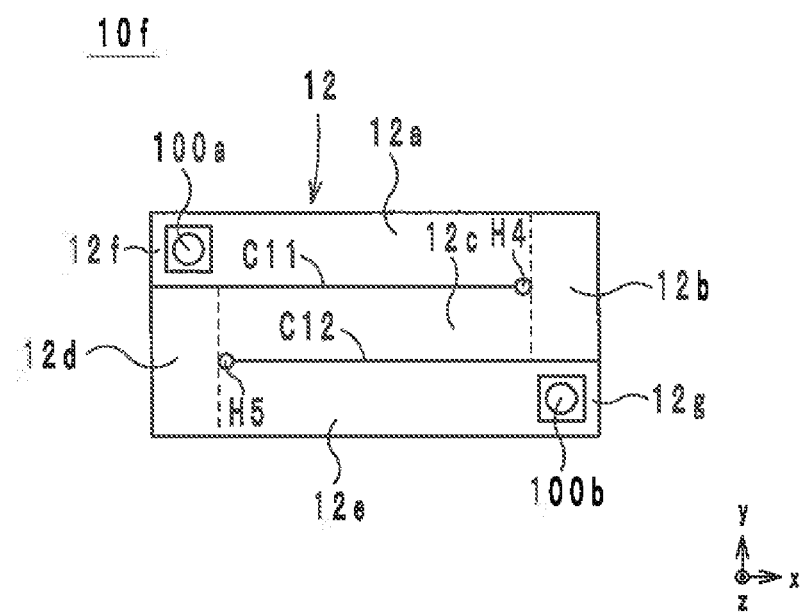
F I G . 2 6
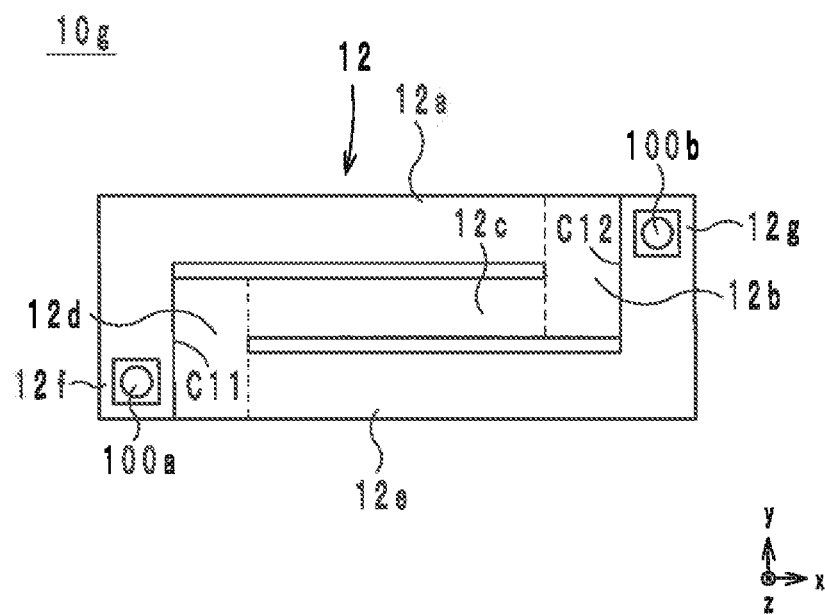

FIG. 29A
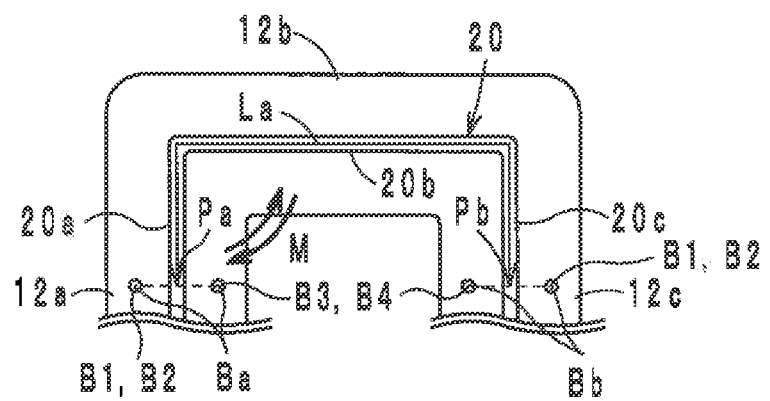
FIG. 29B
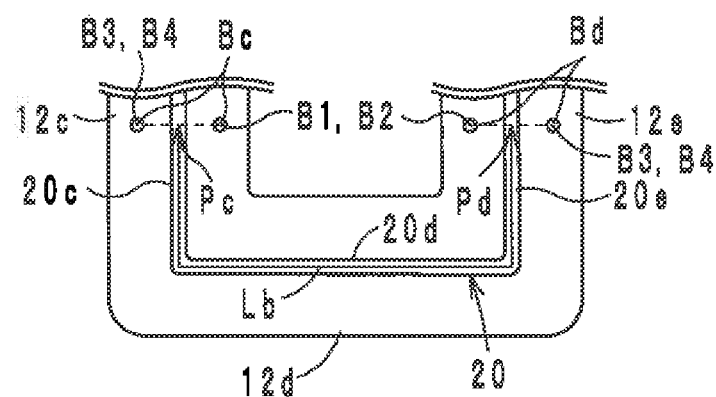
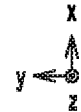

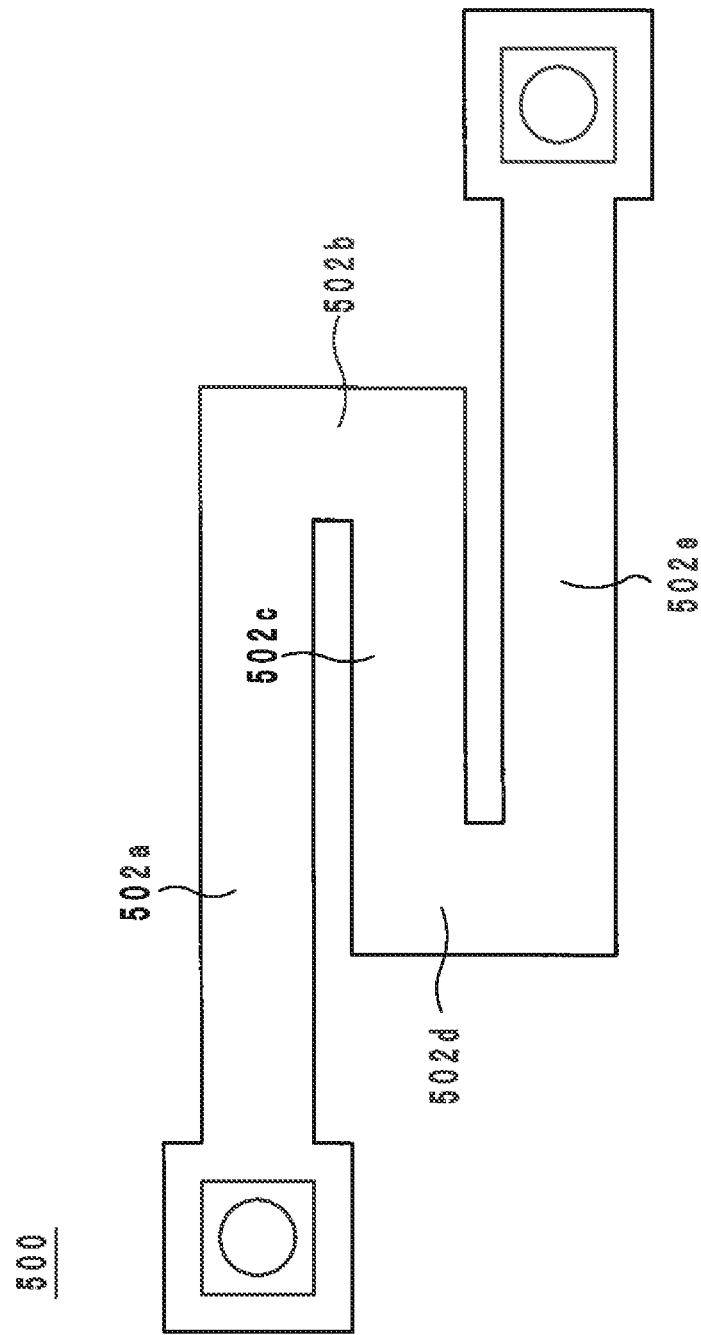

F I G . 3 2
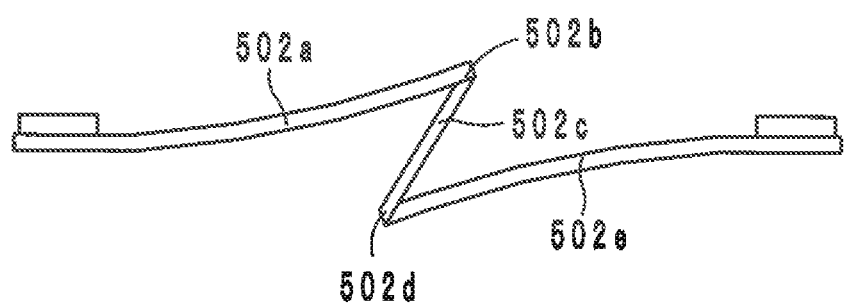

HIGH-FREQUENCY SIGNAL LINE AND ELECTRONIC DEVICE INCLUDING THE SAME

BACKGROUND OF THE INVENTION

1. Field of the Invention

The present invention relates to a high-frequency signal line and an electronic device including the same, and more particularly to a high-frequency signal line preferably used for high-frequency signal transmission and an electronic device including the same.

2. Description of the Related Art

As a conventional high-frequency signal line, for example, a signal line disclosed in WO 2012/073591 is known. The high-frequency signal line includes a dielectric body, a signal line and two ground conductors. The dielectric body is a laminate of dielectric sheets. The signal line is located in the dielectric body. The two ground conductors are located in the dielectric body so as to sandwich the signal line in the direction of lamination. Accordingly, the signal line and the two ground conductors form a stripline structure.

One of the ground conductors has a plurality of openings at positions over the signal line when viewed from the direction of lamination. Thereby, little capacitance is created between the signal line and the ground conductor. Therefore, it is possible to reduce the distance in the direction of lamination between the signal line and the ground conductor having the openings, and it is possible to make the high-frequency signal line thinner. This high-frequency signal line is used, for example, to connect two circuit boards.

In order to facilitate the work for connection of two circuit boards via the high-frequency signal line disclosed in WO 2012/073591, the central portion of the high-frequency signal line in the lengthwise direction may be formed into a meandering shape. FIG. 31 illustrates a high-frequency signal line 500 of which a central portion in the lengthwise direction is meandering. FIG. 32 indicates a state where both ends of the high-frequency signal line 500 are pulled.

As seen in FIG. 31, the central portion of the high-frequency signal line 500 is meandering. Specifically, the high-frequency signal line 500 includes serially-connected line portions 502a through 502e. The line portion 502a extends in a right-left direction. The line portion 502b extends downward from the right end of the line portion 502a. The line portion 502c extends leftward from the lower end of the line portion 502b. The line portion 502d extends downward from the left end of the line portion 502c. The line portion 502e extends rightward from the lower end of the line portion 502d. The lengths of the line portions 502b and 502d are significantly shorter than the lengths of the line portions 502a, 502c and 502e.

When the high-frequency signal line 500 is used to connect two circuit boards to each other, the left end of the line portion 502a is pulled leftward, and the right end of the line portion 502e is pulled rightward. In this state, as illustrated in FIG. 32, the high-frequency signal line 500 is deformed into a Z shape. Thereby, the distance between connectors provided on the both ends of the high-frequency signal line 500 is lengthened. Therefore, it is easy to connect the two connectors to the two circuit boards, respectively.

The high-frequency signal line 500, however, has a problem that via-hole conductors connecting the internally-provided two ground conductors may be damaged. More specifically, the high-frequency signal line 500 has a signal line and two ground conductors inside such that the signal line and the two ground conductors form a stripline structure, and the two ground conductors are connected to each other by via-hole conductors.

When the left end of the line portion 502a and the right-end of the line portion 502e are pulled leftward and rightward respectively, the line portions 502b and 502d are twisted. At this moment, a force is applied to the via-hole conductors provided in the line portions 502b and 502d, and the via-hole conductors may be damaged.

SUMMARY OF THE INVENTION

Preferred embodiments of the present invention provide a high-frequency signal line capable of diminishing the risk of damage to an interlayer connection conductor, and an electronic device including the high-frequency signal line.

A high-frequency signal line according to a preferred embodiment of the present invention includes a dielectric body including flexible dielectric sheets laminated on each other, the dielectric body including a first line portion extending in a specified direction, a second line portion extending along the first line portion, and a third line portion connecting an end of the first line portion in the specified direction and an end of the third line portion in the specified direction to each other, the third line portion being shorter than the first and second line portions; a signal line extending through the first line portion, the second line portion and the third line portion; a first ground conductor located in a portion of the dielectric body on one side in the lamination direction relative to the signal line so as to face the signal line; a second ground conductor located in a portion of the dielectric body on another side in the lamination direction relative to the signal line so as to face the signal line; and one or more interlayer connection conductors pierced in the dielectric sheets to connect the first ground conductor and the second ground conductor to each other. At least one of the interlayer connection conductors is provided in at least one of the first line portion and the second line portion, and none of the interlayer connection conductors is provided in a portion of the third line portion that is farther in a direction opposite to the specified direction than the signal line when viewed from the direction of lamination.

An electronic device according to a preferred embodiment of the present invention includes a case, and a high-frequency signal line housed in the case. The high-frequency signal line includes a dielectric body including flexible dielectric sheets laminated on each other, the dielectric body including a first line portion extending in a specified direction, a second line portion extending along the first line portion, and a third line portion connecting an end of the first line portion in the specified direction and an end of the third line portion in the specified direction to each other, the third line portion being shorter than the first and second line portions; a signal line extending along the first line portion, the second line portion and the third line portion; a first ground conductor located in a portion of the dielectric body on one side in the lamination direction relative to the signal line so as to face the signal line; a second ground conductor located in a portion of the dielectric body on another side in the lamination direction relative to the signal line so as to face the signal line; and one or more interlayer connection conductors pierced in the dielectric sheets to connect the first ground conductor and the second ground conductor to each other. At least one of the interlayer connection conductors is provided in at least one of the first line portion and the second line portion, and none of the interlayer connection conductors is provided in a portion of the third line portion that is farther in a direction opposite to the specified direction than the signal line when viewed from the direction of lamination.

Various preferred embodiments of the present invention prevent or diminish damage to an interlayer connection conductor.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2 is an exploded view of the high-frequency signal line illustrated in FIG. 1.

FIG. 7 is a sectional view of the high-frequency signal line cut along the line A-A in FIG. 2.

FIG. 8 is a sectional view of the high-frequency signal line cut along the line B-B in FIG. 2.

FIG. 14 is an exploded view of a high-frequency signal line according to a first modification of a preferred embodiment of the present invention.

FIG. 18 is an exploded view of the high-frequency signal line according to the second modification of a preferred embodiment of the present invention.

FIG. 21 is a plan view from the z-direction of a high-frequency signal line according to a third modification of a preferred embodiment of the present invention.

FIG. 22 is a plan view from the z-direction of a high-frequency signal line according to a fourth modification of a preferred embodiment of the present invention.

FIG. 23 is a plan view from the z-direction of a high-frequency signal line according to a fifth modification of a preferred embodiment of the present invention.

FIG. 25 is a plan view from the z-direction of a high-frequency signal line according to a sixth modification of a preferred embodiment of the present invention.

FIG. 26 is a plan view from the z-direction of a high-frequency signal line according to a seventh modification of a preferred embodiment of the present invention.

FIG. 29A is a plan view from the z-direction of a high-frequency signal line according to a tenth modification of a preferred embodiment of the present invention.

FIG. 29B is a plan view from the z-direction of the high-frequency signal line according to the tenth modification of a preferred embodiment of the present invention.

FIG. 31 illustrates a high-frequency signal line of which a central portion in the lengthwise direction is meandering.

FIG. 32 illustrates the high-frequency signal line in a state where both ends of the high-frequency signal line are pulled.

DETAILED DESCRIPTION OF THE PREFERRED EMBODIMENTS

A high-frequency signal line according to preferred embodiments of the present invention and an electronic device including the high-frequency signal line will be described with reference to the drawings.

Figure 1:
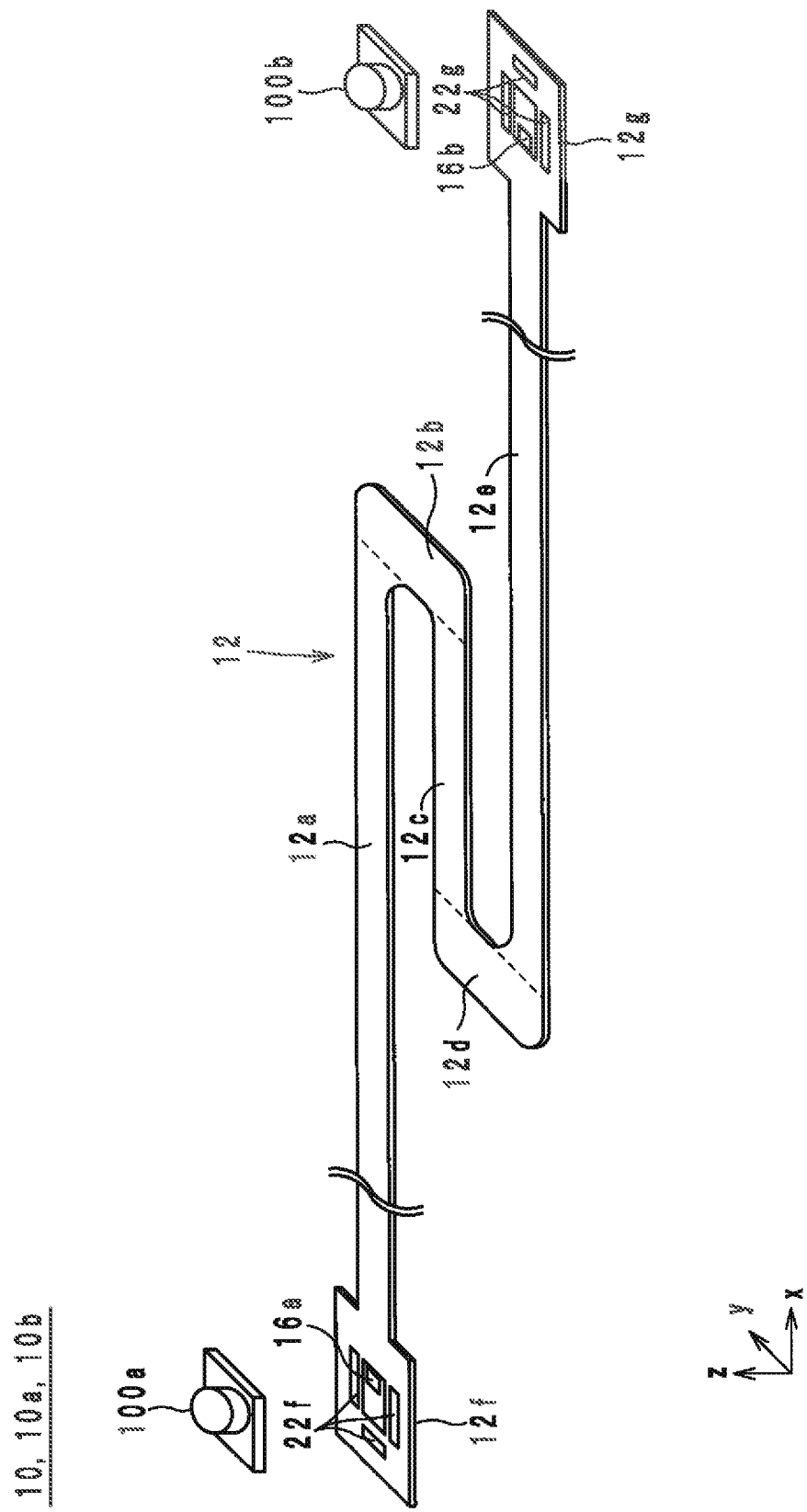
FIG. 1 is a perspective view of a high-frequency signal line according to a preferred embodiment of the present invention.

The structure of a high-frequency signal line according to a preferred embodiment of the present invention is described with reference to the drawings. FIG. 1 is a perspective view of a high-frequency signal line 10 according to a preferred embodiment of the present invention. FIGS. 2 through 6 are exploded views of the high-frequency signal line 10 illustrated in FIG. 1. FIG. 7 is a sectional view cut along the line A-A in FIG. 1. FIG. 8 is a sectional view cut along the line B-B in FIG. 1. In the following, the direction of lamination of the high-frequency signal line 10 is defined as a z-direction. The lengthwise direction of the high-frequency signal line 10 is defined as an x-direction, and the direction perpendicular to the x-direction and the z-direction is defined as a y-direction.

The high-frequency signal line 10 is preferably used, for example, to connect two high-frequency circuits in an electronic device such as a cell-phone. As illustrated in FIGS. 1 through 8, the high-frequency signal line 10 includes a dielectric body 12, external terminals 16a and 16b, a signal line 20, a main ground conductor 22, an auxiliary ground conductor 24, via-hole conductors (interlayer connection conductors) b1, b2 and B1 through B4, and connectors 100a and 100b.

The dielectric body 12 is, as illustrated in FIG. 1, a flexible plate-shaped member extending in the x-direction when viewed from the z-direction. The dielectric body 12 meanders such that the central portion in the x-direction oscillates in the y-direction. The dielectric body 12 includes line portions 12a through 12e, and connecting portions 12f and 12g. As illustrated in FIGS. 2 through 6, the dielectric body 12 is a laminate of a protective layer 14, and dielectric sheets 18a through 18c laminated in this order from a positive side to a negative side in the z-direction. A main surface of the dielectric body 12 on the positive side in the z-direction is hereinafter referred to as a top surface, and a main surface of the dielectric body 12 on the negative side in the z-direction is hereinafter referred to as a bottom surface.

As seen in FIG. 1, the line portion 12a (first line portion) is a strip-shaped portion extending in the x-direction and having a constant or substantially constant width (constant size in the y-direction). The line portion 12c (second line portion) is, as seen in FIG. 1, a strip-shaped portion extending in the x-direction along the line portion 12a and having a constant or substantially constant width (constant size in the y-direction). The line portion 12c is located farther in the negative y-direction than the line portion 12a. A positive end in the x-direction of the line portion 12a and a positive end in the x-direction of the line portion 12c are side by side in the y-direction. However, the line portion 12a is longer than the line portion 12c, and a negative end in the x-direction of the line portion 12a and a negative end in the x-direction of the line portion 12c are not side by side in the y-direction. The line portion 12b (third line portion) is a strip-shaped portion extending in the y-direction and having a constant or substantially constant width (constant size in the x-direction). The line portion 12b connects the positive end in the x-direction of the line portion 12a and the positive end in the x-direction of the line portion 12c to each other. The line portion 12b is shorter than the line portions 12a and 12c.

The line portion 12e (fourth line portion) is, as seen in FIG. 1, a strip-shaped portion extending in the x-direction along the line portion 12c and having a constant width (constant size in the y-direction). The line portion 12e is located farther in the negative y-direction than the line portion 12c. Accordingly, the line portion 12e is on the opposite side of the line portion 12c from the line portion 12a. A negative end in the x-direction of the line portion 12c and a negative end in the x-direction of the line portion 12e are side by side in the y-direction. However, the line portion 12e is longer than the line portion 12c, and a positive end in the x-direction of the line portion 12c and a positive end in the x-direction of the line portion 12e are not side by side in the y-direction. The line portion 12d (fifth line portion) is a strip-shaped portion extending in the y-direction and having a constant width (constant size in the x-direction). The line portion 12d connects the negative end in the x-direction of the line portion 12c and the negative end in the x-direction of the line portion 12e to each other. The line portion 12d is shorter than the line portions 12c and 12e. The widths (sizes in the y-direction) of the line portions 12a, 12c and 12e and the widths (sizes in the x-direction) of the line portions 12b and 12d are equal or substantially equal to one another. In FIG. 1, the borders between the line portions 12a through 12e are indicated by dotted lines.

The connecting portions 12f and 12g are connected to the negative end in the x-direction of the line portion 12a and the positive end in the x-direction of the line portion 12e, respectively. The connecting portions 12f and 12g preferably are rectangular or substantially rectangular when viewed from the z-direction. The widths (sizes in the y-direction) of the connecting portions 12f and 12g are greater than the widths (sizes in the y-direction) of the line portions 12a, 12c and 12e and the widths (sizes in the x-direction) of the line portions 12b and 12d.

As illustrated in FIGS. 2 through 6, the dielectric sheets 18a through 18c have the same shape as the dielectric body 12 when viewed from the z-direction. The dielectric sheets 18a through 18c are preferably made of flexible thermoplastic resin, such as polyimide, liquid polymer or the like. In the following, a main surface of each of the dielectric sheets 18a through 18c on the positive side in the z-direction is referred to as an upper surface, and a main surface of each of the dielectric sheets 18a through 18c on the negative side in the z-direction is referred to as a lower surface.

As indicated in FIGS. 7 and 8, the thickness T1 of the dielectric sheet 18a is greater than the thickness T2 of the dielectric sheet 18b. After a laminating process of the dielectric sheets 18a through 18c, the thickness T1 preferably is, for example, within a range from about 50 μm to about 300 μm. In this preferred embodiment, the thickness T1 preferably is about 100 μm, for example. The thickness T2 preferably is, for example, within a range from about 10 μm to about 100 μm, for example. In this preferred embodiment, the thickness T2 preferably is about 50 μm, for example.

As illustrated in FIGS. 2 through 6, the dielectric sheet 18a includes line portions 18a-a through 18a-e, and connecting portions 18a-f and 18a-g. The dielectric sheet 18b includes line portions 18b-a through 18b-e, and connecting portions 18b-f and 18b-g. The dielectric sheet 18c includes line portions 18c-a through 18c-e, and connecting portions 18c-f and 18c-g. The line portions 18a-a, 18b-a and 18c-a constitute the line portion 12a. The line portions 18a-b, 18b-b and 18c-b constitute the line portion 12b. The line portions 18a-c, 18b-c and 18c-c constitute the line portion 12c. The line portions 18a-d, 18b-d and 18c-d constitute the line portion 12d. The line portions 18a-e, 18b-e and 18c-e constitute the line portion 12e. The connecting portions 18a-f, 18b-f and 18c-f constitute the connecting portion 12f. The connecting portions 18a-g, 18b-g and 18c-g constitute the connecting portion 12g.

The signal line 20, which a high-frequency signal is to be transmitted through, extends through the line portions 12a through 12e and the connecting portions 12f and 12g, as illustrated in FIGS. 2 through 6. In other words, the signal line 20 is a linear conductor extending from the connecting portion 12f to the connecting portion 12g all through the line portions 12a through 12e. In this preferred embodiment, the signal line 20 preferably is provided on the upper surface of the dielectric sheet 18b. The signal line 20 includes line conductors 20a through 20f.

The line conductor 20a extends in the x-direction on the line portion 18b-a running through the center or substantially the center of the line portion 18b-a with respect to the y-direction. The line conductor 20b extends in the y-direction on the line portion 18b-b running through the center or substantially the center of the line portion 18b-b with respect to the x-direction. The line conductor 20c extends in the x-direction on the line portion 18b-c running through the center or substantially the center of the line portion 18b-c with respect to the y-direction. The line conductor 20d extends in the y-direction on the line portion 18b-d running through the center or substantially the center of the line portion 18b-d with respect to the x-direction. The line conductor 20e extends in the x-direction on the line portion 18b-e running through the center or substantially the center of the line portion 18b-e with respect to the y-direction. The line conductors 20a through 20e are connected serially in this order.

Figure 3:
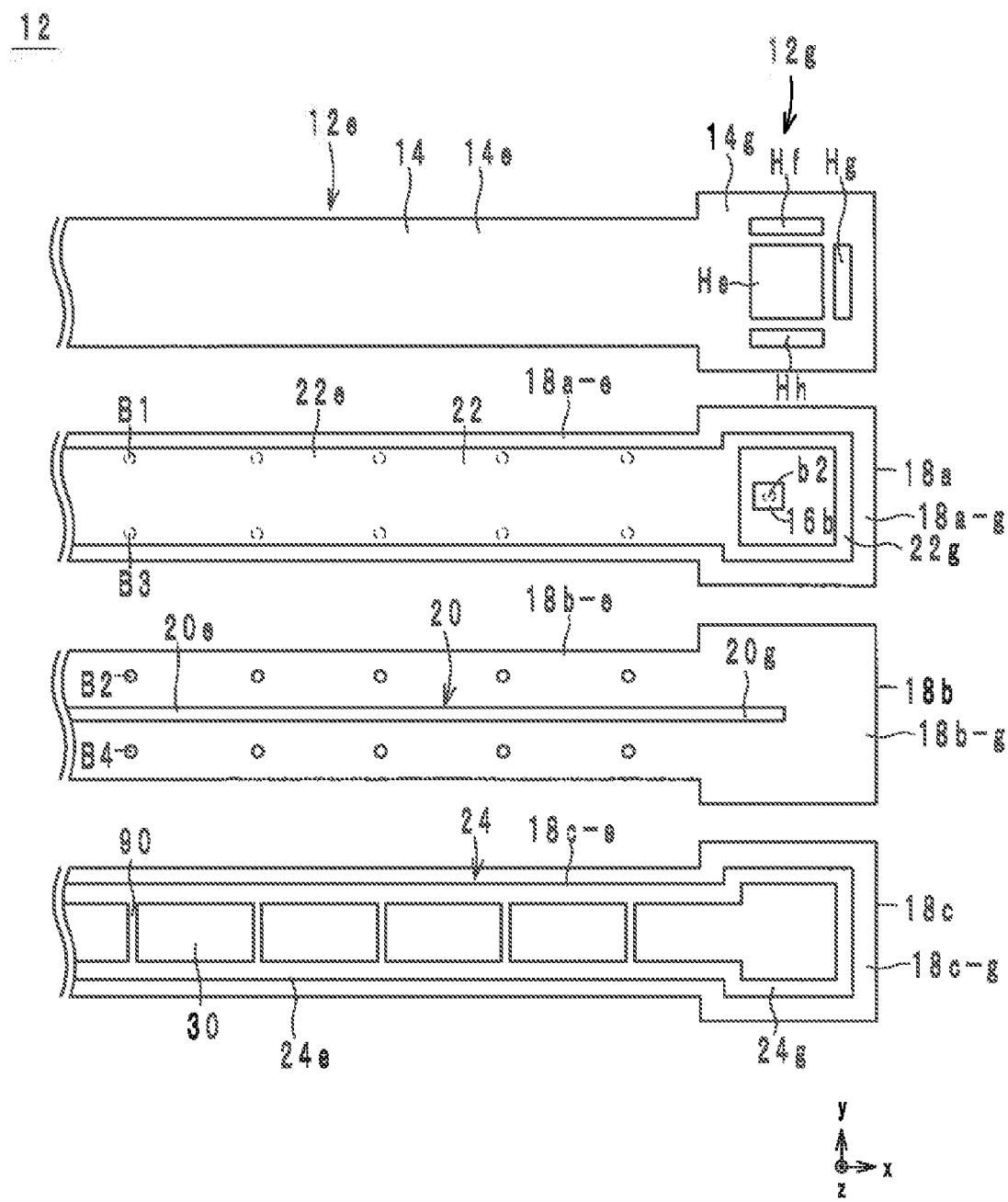
FIG. 3 is an exploded view of the high-frequency signal line illustrated in FIG. 1.

The line conductor 20f is connected to a negative end in the x-direction of the line conductor 20a and extends in the x-direction on the connecting portion 18b-f. As seen in FIG. 2, a negative end in the x-direction of the line conductor 20f is located the center or substantially in the center of the connecting portion 18b-f. The line conductor 20g is connected to a positive end in the x-direction of the line conductor 20e and extends in the x-direction on the connecting portion 18b-g. As seen in FIG. 3, a positive end in the x-direction of the line conductor 20g is located the center or substantially in the center of the connecting portion 18b-g.

The line width of the signal line 20 preferably is, for example, within a range from about 300 μm to about 700 μm. In this preferred embodiment, the line width of the signal line 20 preferably is about 300 μm, for example. The signal line 20 preferably is made of a metal material with a low specific resistance including silver or copper. The statement that the signal line 20 is provided on the upper surface of the dielectric sheet 18b means that the signal line 20 is formed preferably by plating the upper surface of the dielectric sheet 18b with a metal foil and by patterning the metal foil or that the signal line 20 is formed preferably by applying a metal foil on the upper surface of the dielectric sheet 18b and preferably by patterning the metal foil. The surface of the signal line 20 is smoothened, and therefore, the surface of the signal line 20 in contact with the dielectric sheet 18b has a greater surface roughness than the surface of the signal line 20 out of contact with the dielectric sheet 18b.

As illustrated in FIGS. 2 through 6, the main ground conductor 22 is a continuous conductor layer located farther in the positive z-direction than the signal line 20. More specifically, the main ground conductor 22 is provided on the upper surface of the dielectric sheet 18a to face the signal line 20 via the dielectric sheet 18a. The main ground conductor 22 has no openings at positions over the signal line 20. The characteristic impedance of the high-frequency signal line 10 is determined mainly depending on the area where the signal line 20 and the main ground conductor 22 face each other, the distance between the signal line 20 and the main ground conductor 22 and the relative permittivity of the dielectric sheets 18a through 18c. Therefore, in a case where the high-frequency signal line 10 is intended to have characteristic impedance of about 50Ω, for example, the characteristic impedance of the high-frequency signal line 10 determined from the signal line 20 and the main ground conductor 22 is preferably set, for example, to about 55Ω that is a little higher than about 50Ω. Then, the configuration of the auxiliary ground conductor 24 is adjusted such that the characteristic impedance of the high-frequency signal line 10 determined from the signal line 20, the main ground conductor 22 and the auxiliary ground conductor 24 will be about 50Ω, for example. The configuration of the auxiliary ground conductor 24 will be described later.

The main ground conductor 22 is preferably made of a metal material with a low specific resistance including silver or copper. The statement that the main ground conductor 22 is provided on the upper surface of the dielectric sheet 18a means that the main ground conductor 22 is formed preferably by plating the upper surface of the dielectric sheet 18a with a metal foil and preferably by patterning the metal foil or that the main ground conductor 22 is formed preferably by applying a metal foil on the upper surface of the dielectric sheet 18a and by patterning the metal foil. The surface of the main ground conductor 22 is smoothened, and therefore, the surface of the main ground conductor 22 in contact with the dielectric sheet 18a has a greater surface roughness than the surface of the main ground conductor 22 out of contact with the dielectric sheet 18a.

As illustrated in FIGS. 2 through 6, the main ground conductor 22 includes main conductors 22a through 22e and terminal conductors 22f and 22g. The main conductor 22a is provided on the upper surface of the line portion 18a-a to extend in the x-direction. The main conductor 22b is provided on the upper surface of the line portion 18a-b to extend in the y-direction. The main conductor 22c is provided on the upper surface of the line portion 18a-c to extend in the x-direction. The main conductor 22d is provided on the upper surface of the line portion 18a-d to extend in the y-direction. The main conductor 22e is provided on the upper surface of the line portion 18a-e to extend in the x-direction. The main conductors 22a through 22e are connected serially in this order.

The terminal conductor 22f is provided on the upper surface of the connecting portion 18a-f and preferably is rectangular or substantially rectangular ring-shaped. The terminal conductor 22f is connected to a negative end in the x-direction of the main conductor 22a. The terminal conductor 22g is provided on the upper surface of the connecting portion 18a-g and preferably is rectangular or substantially rectangular ring-shaped. The terminal conductor 22g is connected to a positive end in the x-direction of the main conductor 22e.

As illustrated in FIGS. 2 through 6, the auxiliary ground conductor 24 is located farther in the negative z-direction than the signal line 20. The auxiliary ground conductor 24 includes openings 30 arranged along the signal line 20. More specifically, the auxiliary ground conductor 24 is provided on the upper surface of the dielectric sheet 18c to face the signal line 20 via the dielectric sheet 18b. The auxiliary ground conductor 24 also defines and functions as a shield. In the following, a main surface of the auxiliary ground conductor 24 on the positive side in the z-direction is referred to as an upper surface, and a main surface of the auxiliary ground conductor 24 on the negative side in the z-direction is referred to as a lower surface.

The auxiliary ground conductor 24 is preferably made of a metal material with a low specific resistance including silver or copper. The statement that the auxiliary ground conductor 24 is provided on the upper surface of the dielectric sheet 18c means that the auxiliary ground conductor 24 is formed preferably by plating the upper surface of the dielectric sheet 18c with a metal foil and preferably by patterning the metal foil or that the auxiliary ground conductor 24 is formed preferably by applying a metal foil on the upper surface of the dielectric sheet 18c and preferably by patterning the metal foil. The surface of the auxiliary ground conductor 24 is smoothened, and therefore, the surface of the auxiliary ground conductor 24 in contact with the dielectric sheet 18c has a greater surface roughness than the surface of the auxiliary ground conductor 24 out of contact with the dielectric sheet 18c.

As illustrated in FIGS. 2 through 6, the auxiliary ground conductor 24 includes main conductors 24a through 24e and terminal conductors 24f and 24g. The main conductor 24a is provided on the upper surface of the line portion 18c-a to extend in the x-direction. The main conductor 24b is provided on the upper surface of the line portion 18c-b to extend in the y-direction. The main conductor 24c is provided on the upper surface of the line portion 18c-c to extend in the x-direction. The main conductor 24d is provided on the upper surface of the line portion 18c-d to extend in the y-direction. The main conductor 24e is provided on the upper surface of the line portion 18c-e to extend in the x-direction. The main conductors 24a through 24e are connected serially in this order.

The terminal conductor 24f is provided on the upper surface of the connecting portion 18c-f and preferably is rectangular or substantially rectangular ring-shaped. The terminal conductor 24f is connected to a negative end in the x-direction of the main conductor 24a. The terminal conductor 24g is provided on the upper surface of the connecting portion 18c-g and preferably is rectangular or substantially rectangular ring-shaped. The terminal conductor 24g is connected to a positive end in the x-direction of the main conductor 24e.

As illustrated in FIGS. 2 through 6, the main conductors 24a through 24e include openings 30. Each of the openings 30 provided in the main conductors 24a, 24c and 24e preferably is in the shape of a rectangle with longer sides extending in the x direction, and each of the openings 30 provided in the main conductors 24b and 24d preferably is in the shape of a rectangle with longer sides extending in the y-direction. In the main conductors 24a through 24e, portions between the openings 30 are referred to as bridges 90. Each of the bridges 90 is a linear conductor extending in the y-direction. Thus, each of the main conductors 24a through 24e is shaped like a ladder. When viewed from the z-direction, the openings 30 and the bridges 90 are arranged alternately to be overlapped with the signal line 20. In this preferred embodiment, the signal line 20 extends across the openings 30 and the bridges 90.

As mentioned above, the auxiliary ground conductor 24 is configured to achieve fine-adjustment of the characteristic impedance of the high-frequency signal line 10 such that the characteristic impedance will be about 50Ω, for example. Also, the intervals in the x-direction between the bridges 90 of the auxiliary ground conductor 24 are configured such that radiation noise will not occur within the usable band.

As described above, the signal line 20 is sandwiched between the main ground conductor 22 and the auxiliary ground conductor 24 from the both sides in the z-direction. Thus, the signal line 20, the main ground conductor 22 and the auxiliary ground conductor 24 define a triplate stripline structure. The interval (distance in the z-direction) between the signal line 20 and the main ground conductor 22 is equal or substantially equal to the thickness T1 of the dielectric sheet 18a as illustrated in FIGS. 7 and 8, and the interval preferably is, for example, within a range from about 50 μm to about 300 μm. In this preferred embodiment, the interval between the signal line 20 and the main ground conductor 22 preferably is about 100 μm, for example. The interval (distance in the z-direction) between the signal line 20 and the auxiliary ground conductor 24 is equal or substantially equal to the thickness T2 of the dielectric sheet 18b as illustrated in FIGS. 7 and 8, and the interval preferably is, for example, within a range from about 10 μm to about 100 μm. In this preferred embodiment, the interval between the signal line 20 and the auxiliary ground conductor 24 preferably is about 50 μm, for example. Thus, the distance in the z-direction between the auxiliary ground conductor 24 and the signal line 20 is shorter than the distance in the z-direction between the main ground conductor 22 and the signal line 20.

As seen in FIGS. 1 and 2, the external terminal 16a preferably is a rectangular or substantially rectangular conductor provided in the center of the upper surface of the connecting portion 18a-f of the dielectric sheet 18a. When viewed from the z-direction, the external terminal 16a is located over the negative end in the x-direction of the line conductor 20f of the signal line 20. As seen in FIGS. 1 and 3, the external terminal 16b is a rectangular conductor provided in the center of the upper surface of the connecting portion 18a-g of the dielectric sheet 18a. When viewed from the z-direction, the external terminal 16b is located over the positive end in the x-direction of the line conductor 20g of the signal line 20.

The external terminals 16a and 16b are preferably made of a metal material with a low specific resistance including silver or copper. The surfaces of the external terminals 16a and 16b are preferably plated with Ni/Au. The statement that the external terminals 16a and 16b are provided on the upper surface of the dielectric sheet 18a means that the external terminals 16a and 16b are formed preferably by plating the upper surface of the dielectric sheet 18a with a metal foil and preferably by patterning the metal foil or that the external terminals 16a and 16b are formed preferably by applying a metal foil on the upper surface of the dielectric sheet 18a and preferably by patterning the metal foil. The surfaces of the external terminals 16a and 16b are smoothened, and therefore, the respective surfaces of the external terminals 16a and 16b in contact with the dielectric sheet 18a have a greater surface roughness than the respective surfaces of the external terminals 16a and 16b out of contact with the dielectric sheet 18a.

The via-hole conductor b1, as seen in FIG. 2, is pierced in the connecting portion 18a-f in the z-direction to connect the external terminal 16a and the negative end in the x-direction of the line conductor 20f to each other. The via-hole conductor b2, as seen in FIG. 3, is pierced in the connecting portion 18a-g in the z-direction to connect the external terminal 16b and the positive end in the x-direction of the line conductor 20g to each other. Thereby, the signal line 20 is connected between the external terminals 16a and 16b. The via-hole conductors b1 and b2 are formed by filling through holes made in the dielectric sheet 18a with a metal material.

Figure 4:
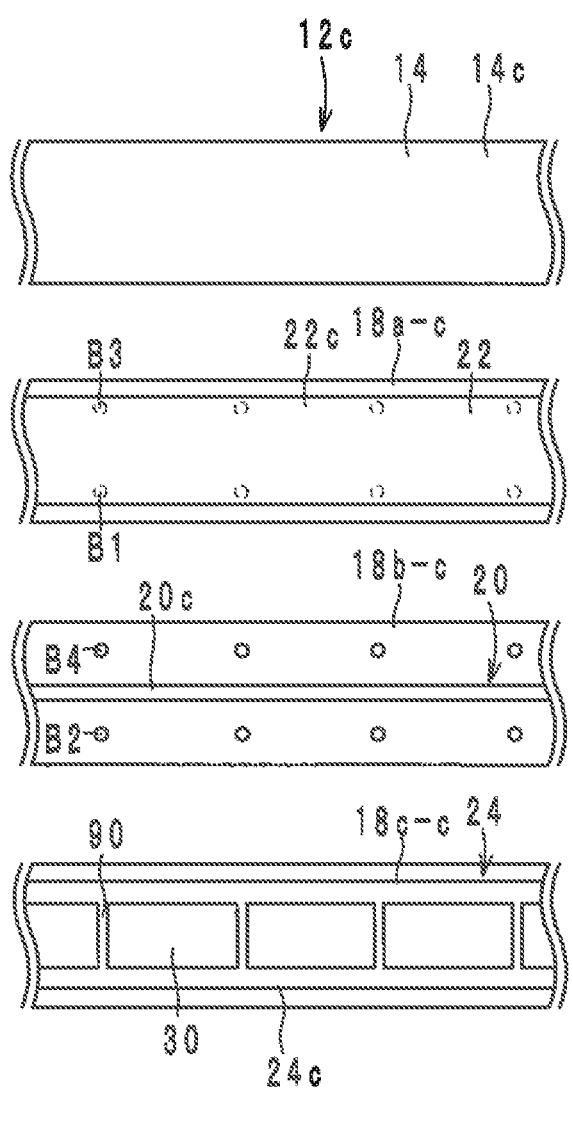
FIG. 4 is an exploded view of the high-frequency signal line illustrated in FIG. 1.
Figure 5:
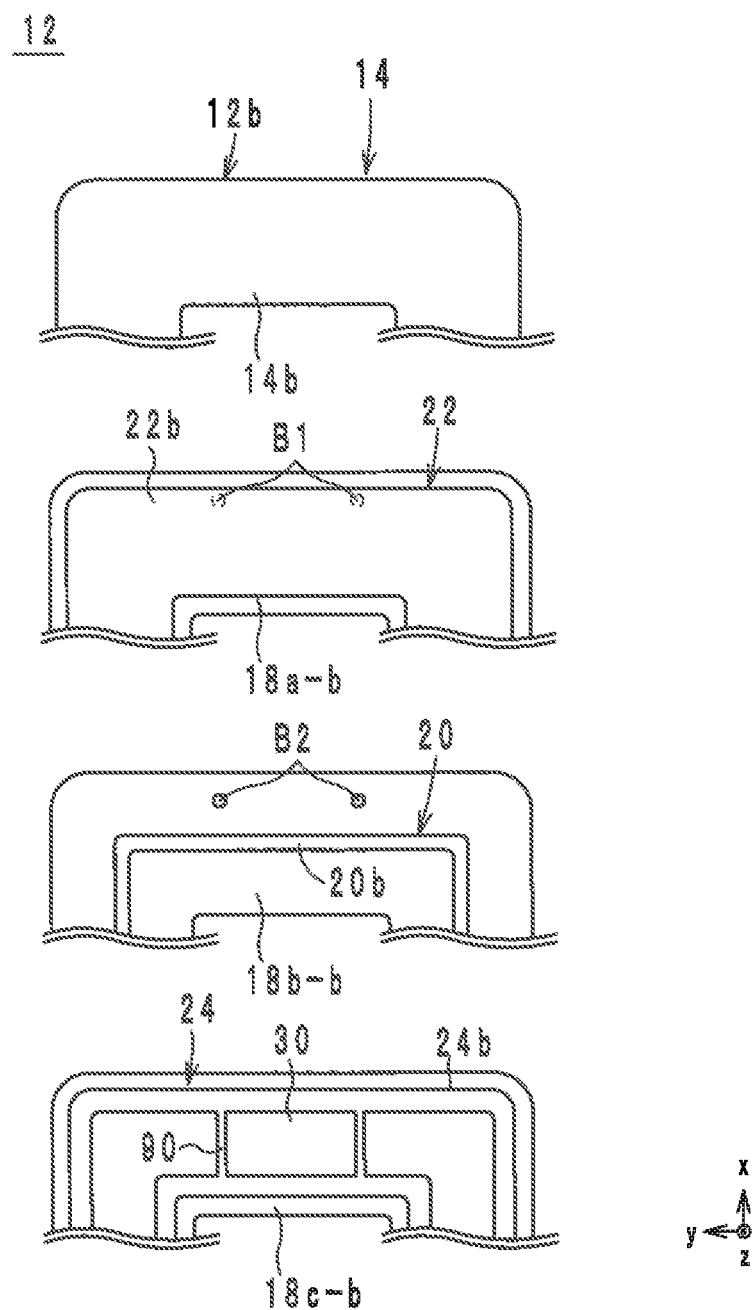
FIG. 5 is an exploded view of the high-frequency signal line illustrated in FIG. 1.
Figure 6:
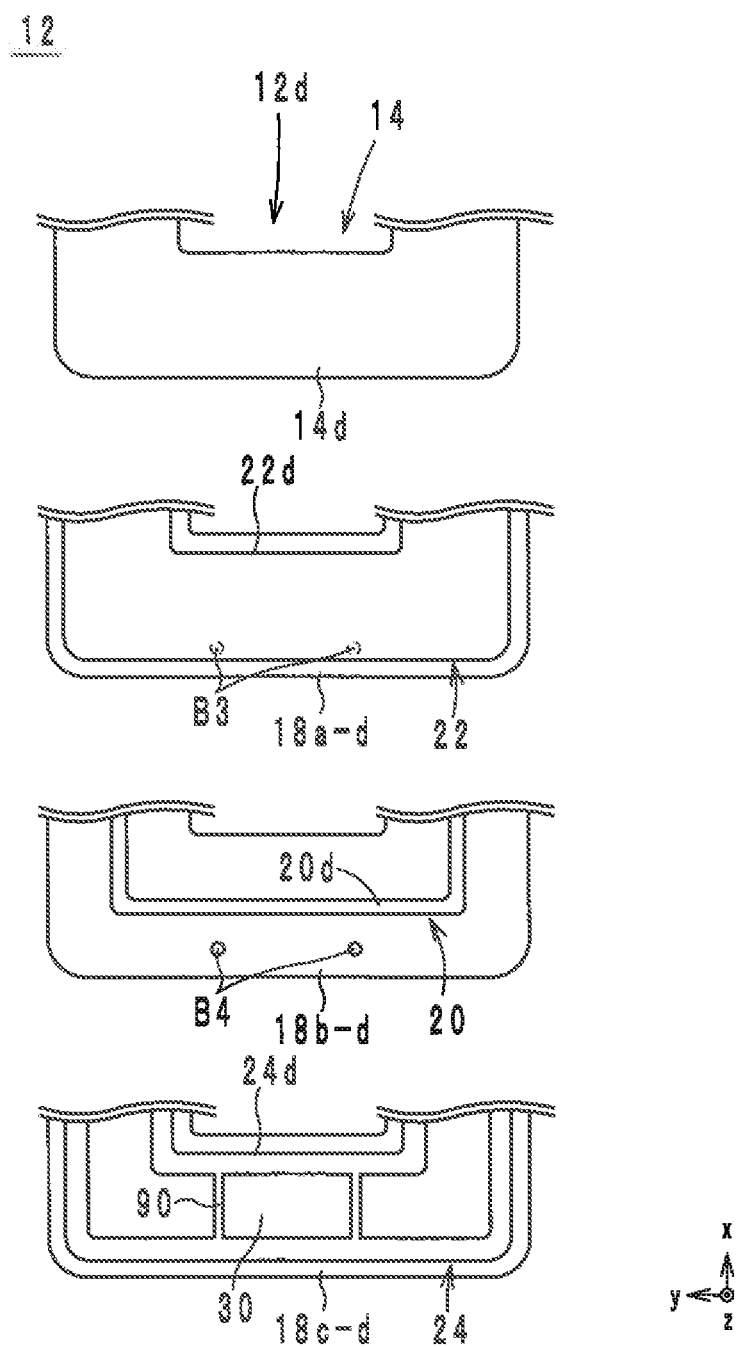
FIG. 6 is an exploded view of the high-frequency signal line illustrated in FIG. 1.

The via-hole conductors B1 are, as seen in FIGS. 2 through 5, pierced in the line portions 18a-a, 18a-b, 18a-c and 18a-e in the z-direction. As illustrated in FIGS. 2 and 3, in each of the line portions 18a-a and 18a-e, the via-hole conductors B1 are located farther in the positive y-direction than the bridges 90 and are aligned in the x-direction. As illustrated in FIG. 5, in the line portion 18a-b, the via-hole conductors B1 are located farther in the positive x-direction than the bridges 90 and are aligned in the y-direction. As illustrated in FIG. 4, in the line portion 18a-c, the via-hole conductors B1 are located farther in the negative y-direction than the bridges 90 and are aligned in the x-direction. As seen in FIG. 6, none of the via-hole conductors B1 is provided in the line portion 18a-d.

The via-hole conductors B2, as seen in FIGS. 2 through 5, are pierced in the line portions 18b-a, 18b-b, 18b-c and 18b-e in the z-direction. As illustrated in FIGS. 2 and 3, in each of the line portions 18b-a and 18b-e, the via-hole conductors B2 are located farther in the positive y-direction than the bridges 90 and are aligned in the x-direction. As illustrated in FIG. 5, in the line portion 18b-b, the via-hole conductors B2 are located farther in the positive x-direction than the bridges 90 and are aligned in the y-direction. As illustrated in FIG. 4, in the line portion 18b-c, the via-hole conductors B2 are located farther in the negative y-direction than the bridges 90 and are aligned in the x-direction. As seen in FIG. 6, none of the via-hole conductors B2 is provided at the line portion 18b-d.

The via-hole conductors B1 are connected to the respectively adjacent via-hole conductors B2, and each connected pair of via-hole conductors B1 and B2 defines and serves as one via-hole conductor. Thus, the via-hole conductors B1 and B2 connect the main ground conductor 22 and the auxiliary ground conductor 24 to each other. The via-hole conductors B1 and B2 are formed by filling through holes made in the dielectric sheets 18a and 18b with a metal material.

The via-hole conductors B3, as seen in FIGS. 2 through 4 and 6, are pierced in the line portions 18a-a, 18a-c, 18a-d and 18a-e in the z-direction. As illustrated in FIGS. 2 and 3, in each of the line portions 18a-a and 18a-e, the via-hole conductors B3 are located farther in the negative y-direction than the bridges 90 and are aligned in the x-direction. As illustrated in FIG. 4, in the line portion 18a-c, the via-hole conductors B3 are located farther in the positive y-direction than the bridges 90 and are aligned in the x-direction. As illustrated in FIG. 6, in the line portion 18a-d, the via-hole conductors B3 are farther in the negative x-direction than the bridges 90 and are aligned in the y-direction. As seen in FIG. 5, none of the via-hole conductors B3 is provided at the line portion 18a-b.

The via-hole conductors B4, as seen in FIGS. 2 through 4 and 6, are pierced in the line portions 18b-a, 18b-c, 18b-d and 18b-e in the z-direction. As illustrated in FIGS. 2 and 3, in each of the line portions 18b-a and 18b-e, the via-hole conductors B4 are located farther in the negative y-direction than the bridges 90 and are aligned in the x-direction. As illustrated in FIG. 4, in the line portion 18b-c, the via-hole conductors B4 are located farther in the positive y-direction than the bridges 90 and are aligned in the x-direction. As illustrated in FIG. 6, in the line portion 18b-d, the via-hole conductors B4 are farther in the negative x-direction than the bridges 90 and are aligned in the y-direction. As seen in FIG. 5, none of the via-hole conductors B4 is provided at the line portion 18b-b.

The via-hole conductors B3 are connected to the respectively adjacent via-hole conductors B4, and each connected pair of via-hole conductors B3 and B4 defines and serves as one via-hole conductor. Thus, the via-hole conductors B3 and B4 connect the main ground conductor 22 and the auxiliary ground conductor 24 to each other. The via-hole conductors B3 and B4 are formed by filling through holes made in the dielectric sheets 18a and 18b with a metal material.

Thus, when the line portion 12d of the dielectric body 12 is viewed from the z-direction, as illustrated in FIG. 6, the via-hole conductors B1 and B2 are not provided in the portion farther in the positive x-direction than the line conductor 20d of the signal line 20. In other words, when the line portion 12d of the dielectric body 12 is viewed from the z-direction, there are no via-hole conductors in the portion of the line portion 12d closer to the line portions 12c and 12e than the line conductor 20d. When the line portion 12b of the dielectric body 12 is viewed from the z-direction, as illustrated in FIG. 5, the via-hole conductors B3 and B4 are not provided in the portion farther in the negative x-direction than the line conductor 20b of the signal line 20. In other words, when the line portion 12b of the dielectric body 12 is viewed from the z-direction, there are no via-hole conductors in the portion of the line portion 12b closer to the line portions 12a and 12c than the line conductor 20b.

The protective layer 14 is an insulating layer that covers the substantially entire upper surface of the dielectric sheet 18a. Accordingly, the protective layer 14 covers the main ground conductor 22. The protective layer 14 is preferably made of, for example, flexible resin such as a resist material.

The protective layer 14, as illustrated in FIG. 2, includes line portions 14a through 14e and connecting portions 14f and 14g. The line portions 14a through 14e cover the substantially entire upper surfaces of the line portions 18a-a through 18a-e and accordingly cover the main conductors 22a through 22e.

The connecting portion 14f is connected to a negative end in the x-direction of the line portion 14a and covers the upper surface of the connecting portion 18a-f. However, the connecting portion 14f includes openings Ha through Hd. The opening Ha preferably is a rectangular or substantially rectangular opening made in the center of the connecting portion 14f. The external terminal 16a is exposed to outside through the opening Ha. The opening Hb preferably is a rectangular or substantially rectangular opening located farther in the positive y-direction than the opening Ha. The opening Hc preferably is a rectangular or substantially rectangular opening located farther in the negative x-direction than the opening Ha. The opening Hd preferably is a rectangular or substantially rectangular opening located farther in the negative y-direction than the opening Ha. The terminal conductor 22f is exposed to outside through the openings Hb through Hd and functions as an external terminal. The connecting portion 14g is connected to a positive end in the x-direction of the line portion 14e and covers the upper surface of the connecting portion 18a-g. However, the connecting portion 14g includes openings He through Hh. The opening He preferably is a rectangular or substantially rectangular opening made in the center of the connecting portion 14g. The external terminal 16b is exposed to outside through the opening He. The opening Hf preferably is a rectangular or substantially rectangular opening located farther in the positive y-direction than the opening He. The opening Hg preferably is a rectangular or substantially rectangular opening located farther in the positive x-direction than the opening He. The opening Hh preferably is a rectangular or substantially rectangular opening located farther in the negative y-direction than the opening He. The terminal conductor 22g is exposed to outside through the openings Hf through Hh and functions as an external terminal.

In the high-frequency signal line 10 having the structure above, the characteristic impedance of the signal line 20 changes cyclically between an impedance value Z1 and an impedance value Z2. More specifically, in the portions of the signal line 20 over the openings 30, relatively small capacitance is created between the signal line 20 and each of the main ground conductor 22 and the auxiliary ground conductor 24. Accordingly, the characteristic impedance of the signal line 20 at the portions over the openings 30 is a relatively high value Z1.

In the portions of the signal line 20 over the bridges 90, on the other hand, relatively large capacitance is created between the signal line 20 and each of the main ground conductor 22 and the auxiliary ground conductor 24. Accordingly, the characteristic impedance of the signal line 20 at the portions over the bridges 90 is a relatively low value Z2. In this regard, the openings 30 and the bridges 90 are arranged alternately in the x-direction, and therefore, the characteristic impedance of the signal line 20 changes cyclically between the value Z1 and the value Z2. The impedance value Z1 preferably is, for example, about 55Ω, and the impedance value Z2 preferably is, for example, about 45Ω. The average characteristic impedance of the signal line 20 as a whole preferably is, for example, about 50Ω.

Figure 9:
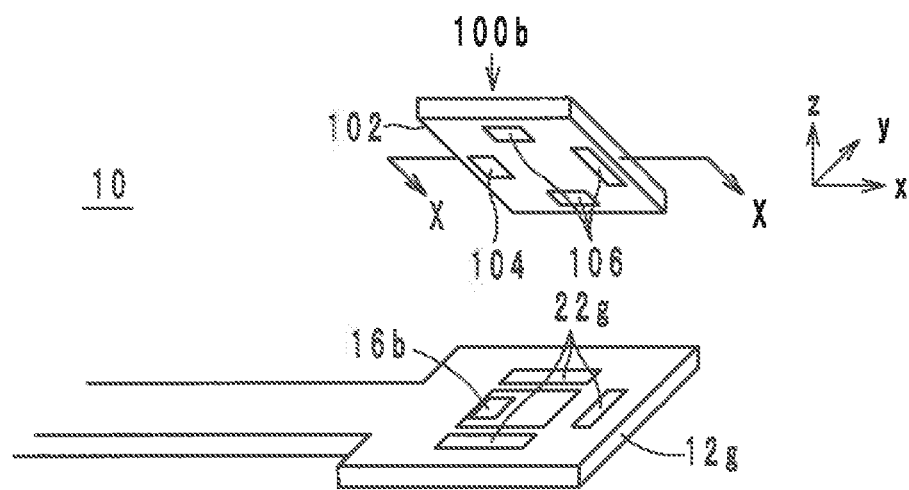
FIG. 9 is a perspective view of a connector of the high-frequency signal line.
Figure 10:
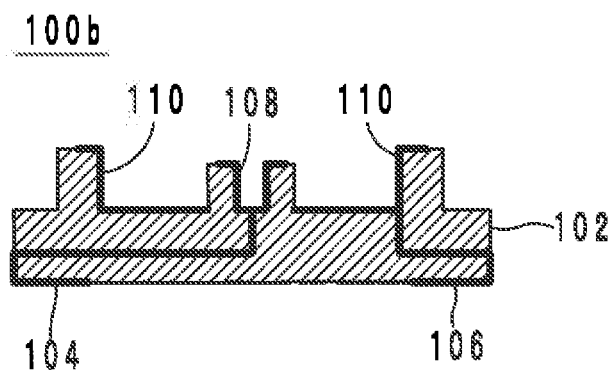
FIG. 10 is a sectional view of the connector of the high-frequency signal line.

The connectors 100a and 100b are, as illustrated in FIG. 1, mounted on the top surfaces of the connecting portions 12f and 12g, respectively. The connectors 100a and 100b have the same structure, and in the following, the structure of the connector 100b is described as an example. FIG. 9 is a perspective view of the connector 100b of the high-frequency signal line 10. FIG. 10 is a sectional view of the connector 100b of the high-frequency signal line 10.

The connector 100b, as illustrated in FIGS. 9 and 10, includes a connector body 102, external terminals 104 and 106, a central conductor 108 and an external conductor 110. The connector body 102 preferably is in the shape of a rectangular or substantially rectangular plate with a cylinder connected thereon, and is preferably made of an insulating material such as resin.

The external terminal 104 is provided on the surface of the plate-shaped portion of the connector body 102 on the negative side in the z-direction so as to face the external terminal 16b. The external terminal 106 is provided on the surface of the plate-shaped portion of the connector body 102 on the negative side in the z-direction so as to face the terminal conductor 22g exposed through the openings Hf through Hh.

The central conductor 108 is located in the center of the cylindrical portion of the connector body 102 and is connected to the external terminal 104. The central conductor 108 is a signal terminal at which a high-frequency signal is input or output. The external conductor 110 is provided on the inner surface of the cylindrical portion of the connector body 102 and is connected to the external terminal 106. The external conductor 110 is a ground terminal that is maintained at a ground potential.

The connector 100b having the structure above is, as illustrated in FIG. 9, mounted on the top surface of the connecting portion 12g such that the external terminal 104 is connected to the external terminal 16b and such that the external terminal 106 is connected to the terminal conductor 22g. Thus, the signal line 20 is electrically connected to the central conductor 108, and the main ground conductor 22 and the auxiliary ground conductor 24 are electrically connected to the external conductor 110.

Figure 11:
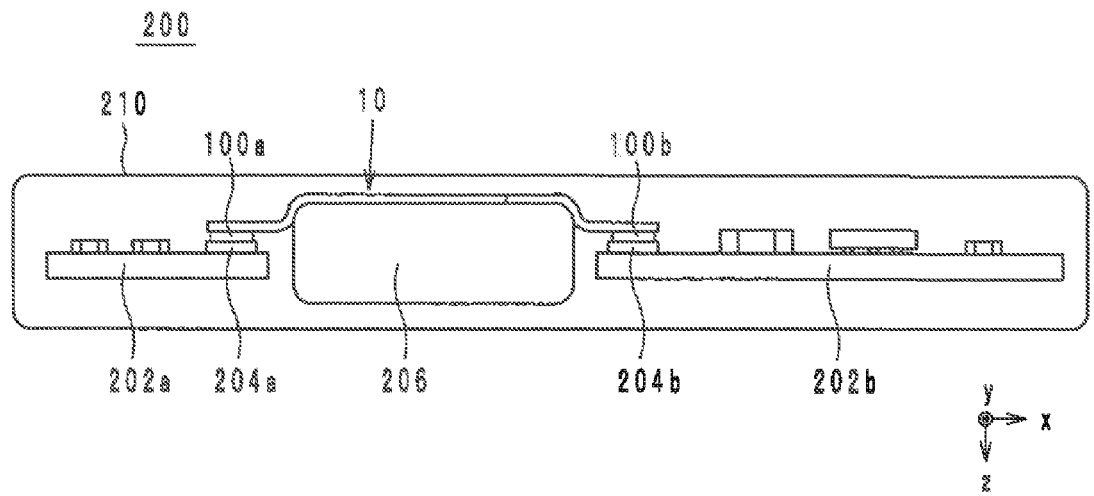
FIG. 11 is a plan view from a y-direction of an electronic device including the high-frequency signal line.
Figure 12:
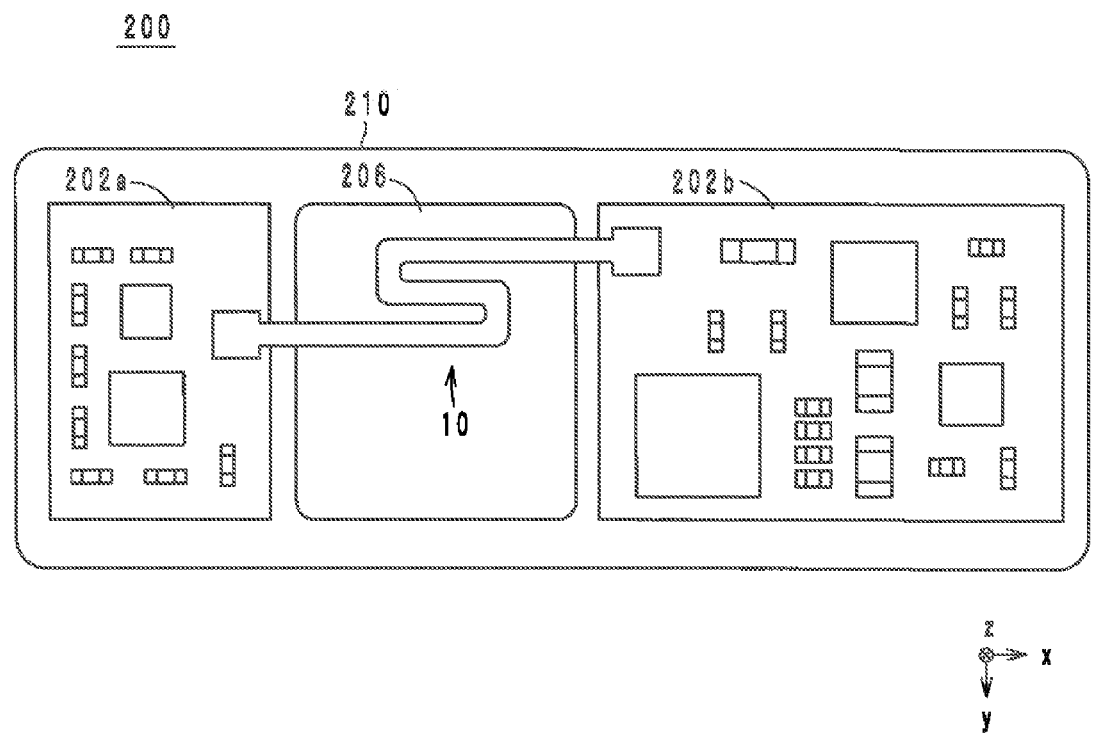
FIG. 12 is a plan view from a z-direction of the electronic device including the high-frequency signal line.
Figure 13:
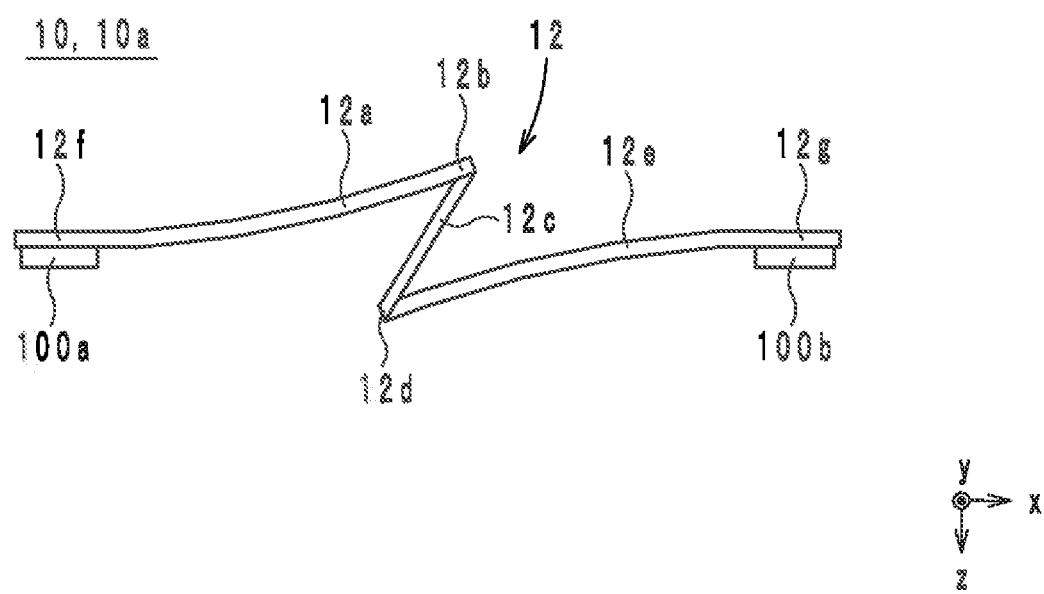
FIG. 13 illustrates the high-frequency signal line when it is fitted to circuit boards.

The high-frequency signal line 10 preferably is used in the following way. FIG. 11 is a plan view from the y-direction of an electronic device 200 including the high-frequency signal line 10. FIG. 12 is a plan view from the z-direction of the electronic device 200 including the high-frequency signal line 10. FIG. 13 illustrates the appearance of the high-frequency signal line 10 during a mounting process thereof onto circuit boards 202a and 202b.

As illustrated in FIGS. 11 and 12, the high-frequency signal line 10 is included in the electronic device 200. The electronic device 200 includes the high-frequency signal line 10, the circuit boards 202a and 202b, receptacles 204a and 204b, a battery pack (metal object) 206, and a case 210.

The case 210 houses the high-frequency signal line 10, the circuit boards 202a and 202b, the receptacles 204a and 204b, and the battery pack 206. In the circuit board 202a, for example, a transmitting circuit or a receiving circuit including an antenna is provided. In the circuit board 202b, for example, a feed circuit is provided. The battery pack 206 is, for example, a lithium-ion secondary battery, and the surface of the battery pack 206 is covered by a metal cover. The circuit board 202a, the battery pack 206 and the circuit board 202b are arranged in this order from the negative side to the positive side in the x-direction.

The receptacles 204a and 204b are provided on respective main surfaces of the circuit boards 202a and 202b on the negative side in the z-direction. The connectors 100a and 100b are connected to the receptacles 204a and 204b, respectively. Thus, a high-frequency signal with a frequency of, for example, 2 GHz to be transmitted between the circuit boards 202a and 202b is applied to the central conductors 108 of the connectors 100a and 100b through the receptacles 204a and 204b. The respective external terminals 110 of the connectors 100a and 100b are maintained at the ground potential through the circuit boards 202a and 202b, and the receptacles 204a and 204b. In this way, the high-frequency signal line 10 connects the circuit boards 202a and 202b to each other.

In this state, the top surface of the dielectric body 12 (specifically, the protective layer 14) is in contact with the battery 206, and the dielectric body 12 is fixed to the battery pack 206 by an adhesive. The top surface of the dielectric body 12 is the main surface of the dielectric body 12 located on the same side as the main ground conductor 22 relative to the signal line 20. Accordingly, the continuous main ground conductor 22 is located between the signal line 20 and the battery pack 206.

In a process of mounting the high-frequency signal line 10 onto the circuit boards 202a and 202b, the connector 100a is pulled in the negative x-direction, and the connector 100b is pulled in the positive x-direction. Accordingly, the line portion 12a is pulled in the negative x-direction, and the line portion 12e is pulled in the positive x-direction. Thus, the positive end in the x-direction of the line portion 12c is pulled in the negative x-direction by the line portion 12a via the line portion 12b, and the negative end in the x-direction of the line portion 12c is pulled in the positive x-direction by the line portion 12e via the line portion 12d. Consequently, the line portion 12c turns counterclockwise when viewed from the positive y-direction, and the line portions 12b and 12d are twisted. Through the movements, the distance between the connectors 100a and 100b in the stretched state as illustrated in FIG. 13 becomes longer than the distance between the connectors 100a and 100b in the unstretched state as illustrated in FIG. 1. In this way, the length of the high-frequency signal line 10 is adjusted, which facilitates the connection of the connectors 100a and 100b to the receptacles 204a and 204b, respectively.

With reference to FIGS. 2 through 6, a producing method of the high-frequency signal line 10 is described below. In the following, a producing method of one high-frequency signal line 10 is described as a non-limiting example. Practically, however, by laminating large-size dielectric sheets and by cutting the laminate, a plurality of high-frequency signal lines are produced at one time.

First, dielectric sheets, each formed of thermoplastic resin and having a copper foil (metal film) entirely on the upper surface, are prepared as the dielectric sheets 18a through 18c. Specifically, copper foils are applied to the respective upper surfaces of the dielectric sheets 18a through 18c. The surfaces of the copper foils are, for example, galvanized for corrosion proof and thus are smoothened. The dielectric sheets 18a through 18c are formed of liquid polymer. The thicknesses of the copper foils are within a range from about 10 μm to about 20 μm, for example.

Next, the external terminals 16a and 16b, and the main ground conductor 22 as illustrated in FIGS. 2 through 6 are formed on the upper surface of the dielectric sheet 18a by patterning the copper foil formed on the upper surface of the dielectric sheet 18a. Specifically, resists having identical shapes to the external terminals 16a and 16b, and the main ground conductor 22 are printed on the copper foil on the upper surface of the dielectric sheet 18a. Then, the copper foil is etched, so that the portions of the copper foil not covered by the resists are removed. Thereafter, the resists are removed. In this way, the external terminals 16a and 16b, and the main ground conductor 22 as illustrated in FIGS. 2 through 6 are formed on the upper surface of the dielectric sheet 18a by photolithography.

Next, the signal line 20 as illustrated in FIGS. 2 through 6 is formed on the upper surface of the dielectric sheet 18b. Further, the auxiliary ground conductor 24 as illustrated in FIGS. 2 through 6 is formed on the upper surface of the dielectric sheet 18c. The process for forming the signal line 20 and the process for forming the auxiliary ground conductor 24 are the same as the process for forming the external terminals 16a and 16b, and the main ground conductor 22, and descriptions of the processes are omitted here.

Next, the dielectric sheets 18a and 18b are exposed to laser beams such that through holes are made in the dielectric sheets 18a and 18b at the positions of the via-hole conductors b1, b2 and B1 through B4. Thereafter, conductive paste is filled in the through holes, and thus, the via-hole conductors b1, b2 and B1 through B4 are formed.

Next, the dielectric sheets 18a through 18c are laminated in this order from the positive side to the negative side in the z-direction, and the dielectric body 12 is formed. Then, heat and pressure are applied to the laminated dielectric sheets 18a through 18c from the positive and negative sides in the z-direction, and thereby, the dielectric sheets 18a through 18c are joined together.

Next, resin (resist) paste is applied to the upper surface of the dielectric sheet 18a by screen printing, and thus, the protective layer 14 covering the main ground conductor 22 is formed.

Lastly, the connector 100a is mounted on the connecting portion 12f and soldered to the external terminal 16a and the terminal conductor 22f, and the connector 100b is mounted on the connecting portion 12g and soldered to the external terminal 16b and the terminal conductor 22g. Through the process above, the high-frequency signal line 10 as illustrated in FIG. 1 is obtained.

In the high-frequency signal line 10 having the structure above, damage of the via-hole conductors B1 through B4 is significantly diminished or prevented. Specifically, as illustrated in FIG. 13, during a process of mounting the high-frequency signal line 10 onto the circuit boards 202a and 202b, the connector 100a is pulled in the negative x-direction, and the connector 100b is pulled in the positive x-direction. In this moment, the line portion 12b is twisted. To the longer side of the line portion 12b on the negative side in the x-direction, the positive end in the x-direction of the line portion 12a and the positive end in the x-direction of the line portion 12c are connected. Thus, the portion of the line portion 12b farther in the negative x-direction than the line conductor 20b is twisted greatly.

In the light of this fact, in the high-frequency signal 10, no via-hole conductors are provided in the portion of the line portion 12b farther in the negative x-direction than the line conductor 20b. Therefore, the risk that the twist of the line portion 12b may cause damage of any via-hole conductor is diminished or eliminated.

The pull of the connector 100a in the negative x-direction and the pull of the connector 100b in the positive x-direction also cause a twist of the line portion 12d. To the longer side of the line portion 12d on the positive side in the x-direction, the negative end in the x-direction of the line portion 12c and the negative end in the x-direction of the line portion 12e are connected. Thus, the portion of the line portion 12d farther in the positive x-direction than the line conductor 20d is twisted greatly.

In the light of this fact, in the high-frequency signal 10, no via-hole conductors are provided in the portion of the line portion 12d farther in the positive x-direction than the line conductor 20d. Therefore, the risk that the twist of the line portion 12d may cause damage of any via-hole conductor can be significantly diminished or prevented. On the other hand, the via-hole conductors B1 through B4 are provided in the line portions 12a, 12c and 12e, and thus, these portions are stabilized at the ground potential.

Further, it is possible to make the high-frequency signal line 10 thinner. Specifically, in the high-frequency signal line 10, the openings 30 are provided in the auxiliary ground conductor 24, and little capacitance is created between the signal line 20 and the auxiliary ground conductor 24. Therefore, even a reduction in the distance between the signal line 20 and the auxiliary ground conductor 24 will not cause a significant increase in the capacitance between the signal line 20 and the auxiliary ground conductor 24 and will not result in a significant shift of the characteristic impedance of the signal line 20 from a designed value (for example, about 50Ω). Thus, it is possible to make the high-frequency signal line 10 thinner while maintaining the characteristic impedance of the signal line 20 at a designed value.

Even when the high-frequency signal line 10 is fixed to a metal object such as the battery pack 206, a change in the characteristic impedance is significantly diminished or prevented. More specifically, the high-frequency signal line 10 is fixed to the battery pack 206 such that the continuous main ground conductor 22 is located between the signal line 20 and the battery pack 206. Therefore, there is no risk that the signal line 20 and the battery pack 206 face each other via openings, and capacitance is prevented from being generated between the signal line 20 and the battery pack 206. Accordingly, the characteristic impedance of the signal line 20 is prevented from being reduced due to the fixation of the high-frequency signal line 10 to the battery pack 206.

First Modification

Figure 15:
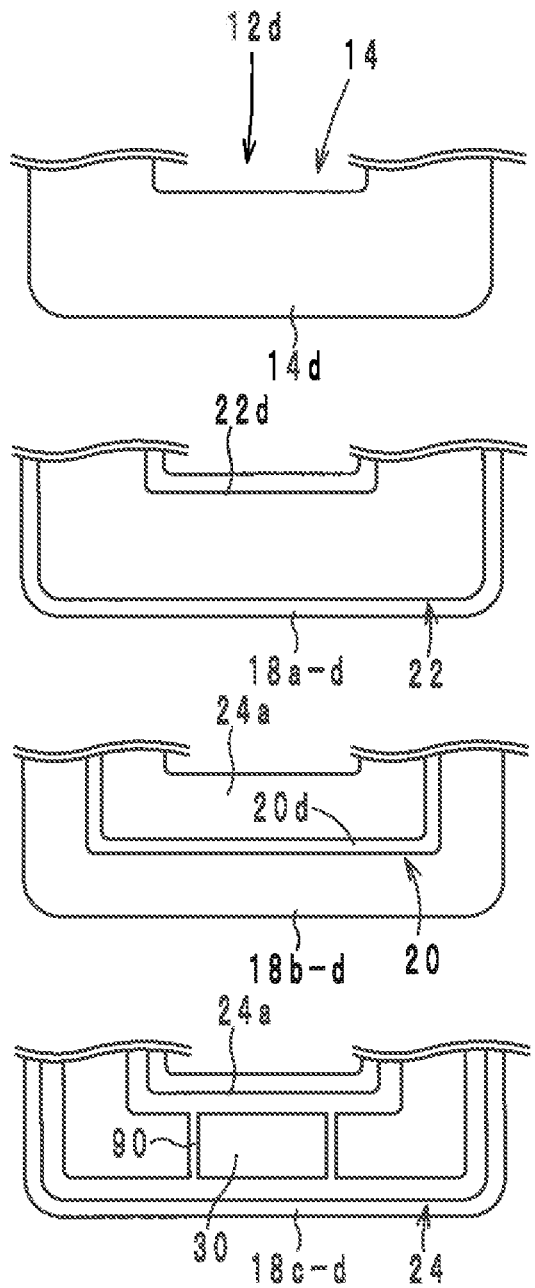
FIG. 15 is an exploded view of the high-frequency signal line according to the first modification of a preferred embodiment of the present invention.

Next, the structure of a high-frequency signal line 10a according to a first modification of a preferred embodiment of the present invention is described with reference to the drawings. FIGS. 14 and 15 are exploded views of the high-frequency signal line 10a according to the first modification. The appearance of the high-frequency signal line 10a is as illustrated in FIG. 1.

The high-frequency signal line 10a is different from the high-frequency signal line 10 in that the high-frequency signal line 10a does not have the via-hole conductors B1 through B4 in the line portions 12b and 12d. The high-frequency signal line 10a is hereinafter described with a focus on the difference.

As seen in FIG. 14, in the line portion 12b, none of the via-hole conductors B1 through B4 is provided in the portion farther in the positive x-direction than the line conductor 20b and in the portion farther in the negative x-direction than the line conductor 20b. Similarly, as seen in FIG. 15, none of the via-hole conductors B1 through B4 is provided in the portion farther in the positive x-direction than the line conductor 20d and in the portion farther in the negative x-direction than the line conductor 20d.

Thus, in the high-frequency signal line 10a, the via-hole conductors B1 through B4 are provided in the line portions 12a, 12c and 12e but are not provided in the line portions 12b and 12d that are twisted when used. Therefore, damage of the via-hole conductors is prevented more effectively.

Second Modification

Next, the structure of a high-frequency signal line 10b according to a second modification of a preferred embodiment of the present invention is described with reference to the drawings. FIGS. 16 through 20 are exploded views of the high-frequency signal line 10b according to the second modification. The appearance of the high-frequency signal line 10a is as illustrated in FIG. 1.

The high-frequency signal line 10b is different from the high-frequency signal line 10 in the shapes of the signal line 20 and the auxiliary ground conductor 24. The high-frequency signal line 10a is hereinafter described with a focus on the difference.

Each of the main conductors 24a and 24e of the auxiliary ground conductor 24 includes openings 30 and 32, each of which is in the shape of a parallelogram with longer sides extending in the x-direction. More specifically, each of the main conductors 24a and 24e includes connecting portions 70 and 72, sides 74 and 76, and bridges 78, 80, 86 and 88. The side 74 is a linear conductor that extends in the x-direction to constitute the negative side in the y-direction of the main conductor 24a. The side 76 is a linear conductor that extends in the x-direction to constitute the positive side in the y-direction of the main conductor 24a. The connecting portions 70 are semicircular and protrude from the side 74 in the positive y-direction. The connecting portions 70 are aligned in the x-direction at uniform intervals. The connecting portions 72 are semicircular and protrude from the side 76 in the negative y-direction. The connecting portions 72 are aligned in the x-direction at uniform intervals. The connecting portions 70 and 72 are located at different positions in the x-direction. In this preferred embodiment, the connecting portions 70 and 72 preferably are arranged alternately in the x-direction. Each of the connecting portions 72 is located on the middle point between adjacent two connecting portions 70 with respect to the x-direction. Each of the connecting portions 70 is located on the middle point between adjacent two connecting portions 72 with respect to the x-direction.

The bridges 78 are linear conductors that extend from the respective connecting portions 70 to the side 76 diagonally so as to run in the positive x-direction while running in the positive y-direction. The bridges 80 are linear conductors that extend from the respective connecting portions 72 to the side 74 diagonally so as to run in the negative x-direction while running in the negative y-direction. The bridges 70 and 80 are parallel or substantially parallel to each other. Accordingly, each of the openings 30 is in an area enclosed by the sides 74 and 76 and adjacent bridges 78 and 80.

The bridges 86 are linear conductors that extend from the respective connecting portions 72 to the side 74 diagonally so as to run in the positive x-direction while running in the negative y-direction. The bridges 88 are linear conductors that extend from the respective connecting portions 70 to the side 76 diagonally so as to run in the negative x-direction while running in the positive y-direction. The bridges 86 and 88 are parallel or substantially parallel to each other. Accordingly, each of the openings 32 is in an area enclosed by the sides 74 and 76 and adjacent bridges 86 and 88.

Each of the main conductors 24a and 24e also has notches C1. In each of the main conductors 24a and 24e, the notches C1 are located farther in the negative y-direction than the connecting portions 72. Thus, the side 74 is divided by the notches C1.

Each of the main conductors 24a and 24e also includes notches C2. In each of the main conductors 24a and 24e, the notches C2 are located farther in the positive y-direction than the connecting portions 70. Thus, the side 76 is divided by the notches C2.

The main conductor 24c of the auxiliary ground conductor 24, as illustrated in FIG. 18, has openings 30 and 32, each of which is in the shape of a parallelogram with longer sides extending in the x-direction. The main conductor 24c has a configuration formed by turning the main conductor 24a or 24e on the z-axis by 180 degrees. A detailed description of the main conductor 24c is omitted.

Figure 19:
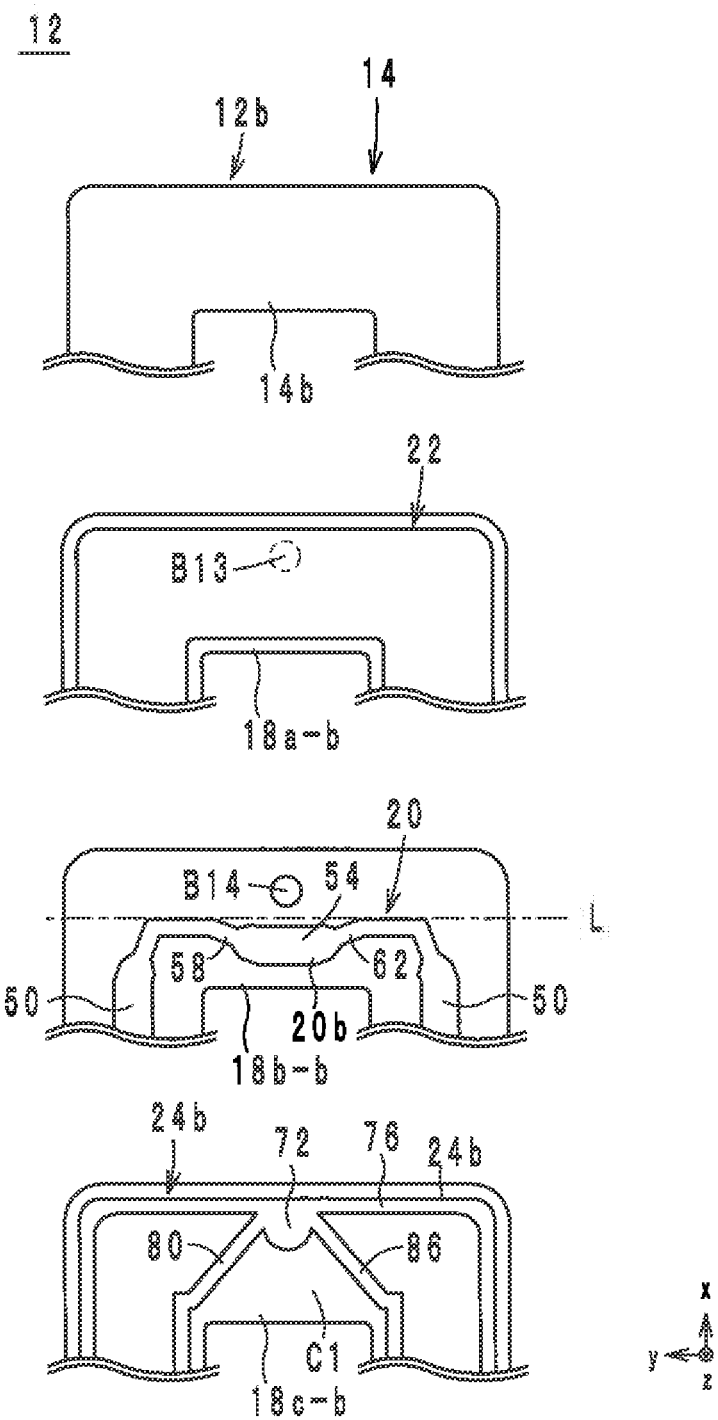
FIG. 19 is an exploded view of the high-frequency signal line according to the second modification of a preferred embodiment of the present invention.

The main conductor 24b of the auxiliary ground conductor 24, as illustrated in FIG. 19, includes a connecting portion 72, a side 76 and bridges 80 and 86. The side 76 is a linear conductor that extends in the y-direction to constitute the positive side in the x-direction of the main conductor 24b. The connecting portion 72 is semicircular and protrudes from the side 76 in the negative x-direction. The connecting portion 72 is located in the center of the side 76 with respect to the y-direction.

The bridge 80 is a linear conductor extending from the connecting portion 72 diagonally so as to run in the positive y-direction while running in the negative x-direction. The bridge 80 is connected to the side 74 in the line portion 12a.

The bridge 86 is a linear conductor extending from the connecting portion 72 diagonally so as to run in the negative y-direction while running in the negative x-direction. The bridge 86 is connected to the side 74 in the line portion 12c.

In this regard, the side 74 is not provided in the main conductor 24b, and the main conductor 24b includes a notch C1.

Figure 20:
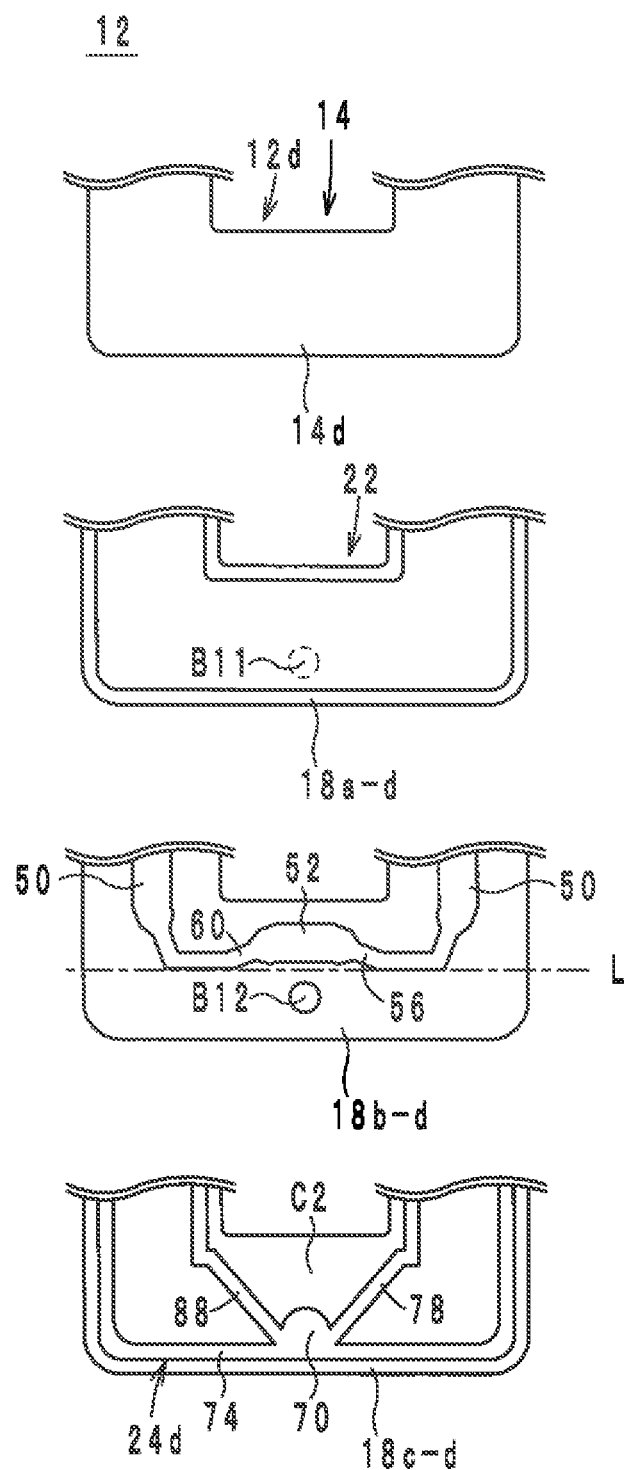
FIG. 20 is an exploded view of the high-frequency signal line according to the second modification of a preferred embodiment of the present invention.

The main conductor 24d of the auxiliary ground conductor 24, as illustrated in FIG. 20, includes a connecting portion 70, a side 74 and bridges 78 and 88. The side 74 is a linear conductor that extends in the y-direction to constitute the negative side in the x-direction of the main conductor 24d. The connecting portion 70 is semicircular and protrudes from the side 74 in the positive x-direction. The connecting portion 70 is located in the center of the side 74 with respect to the y-direction.

The bridge 78 is a linear conductor extending from the connecting portion 70 diagonally so as to run in the negative y-direction while running in the positive x-direction. The bridge 78 is connected to the side 76 in the line portion 12e.

The bridge 88 is a linear conductor extending from the connecting portion 70 diagonally so as to run in the positive y-direction while running in the positive x-direction. The bridge 88 is connected to the side 76 in the line portion 12c.

In this regard, the side 76 is not provided in the main conductor 24d, and the main conductor 24d includes a notch C2.

Figure 16:
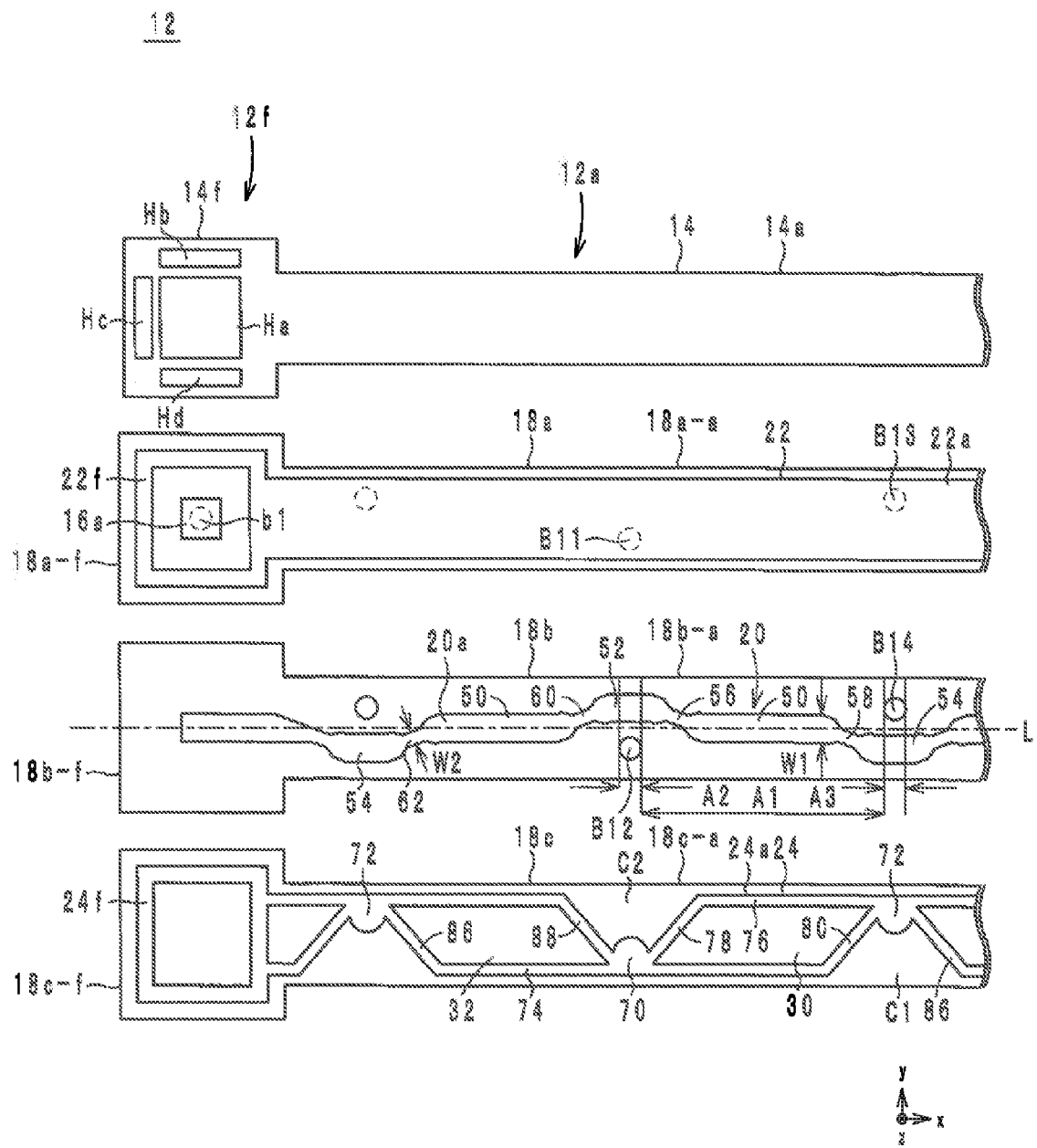
FIG. 16 is an exploded view of a high-frequency signal line according to a second modification of a preferred embodiment of the present invention.
Figure 17:
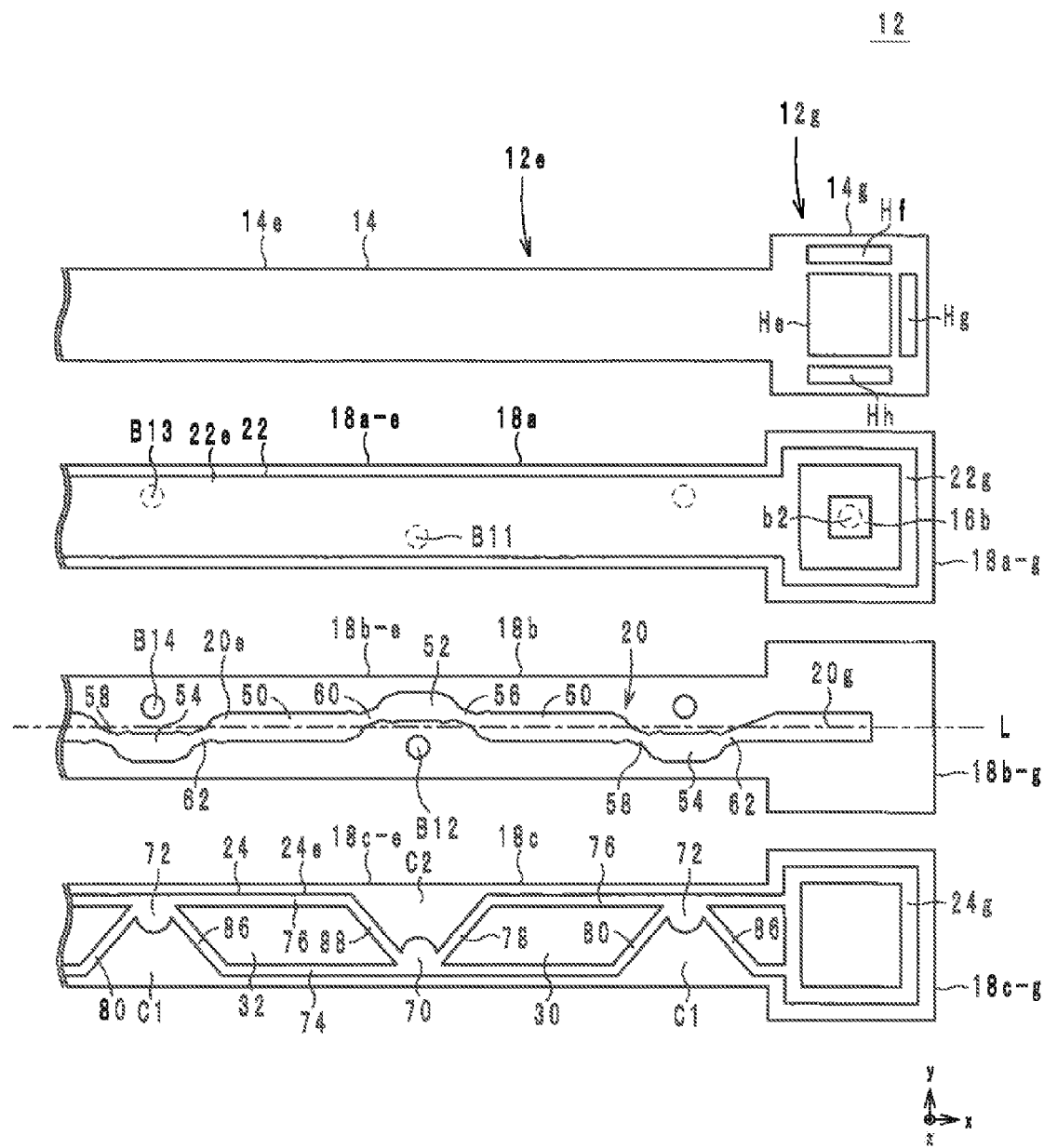
FIG. 17 is an exploded view of the high-frequency signal line according to the second modification of a preferred embodiment of the present invention.

The via-hole conductors B11 are, as illustrated in FIGS. 16 through 20, pierced in the line portions 18a-a, 18a-c, 18a-d and 18a-e in the z-direction. The via-hole conductors B11 pierced in each of the line portions 18a-a and 18a-e are, as seen in FIGS. 16 and 17, aligned in the x-direction in the portion farther in the negative y-direction than the center line L of each of the line portions 12a and 12e with respect to the y-direction. The via-hole conductors B11 pierced in the line portion 18a-c are, as illustrated in FIG. 18, aligned in the x-direction in the portion farther in the positive y-direction than the center line L of the line portion 12*c* with respect to the y-direction. The via-hole conductor B11 pierced in the line portion 18*a*-*d* is, as illustrated in FIG. 20, located in the portion farther in the negative x-direction than the center line L of the line portion 12*d* with respect to the x-direction. As seen in FIG. 19, none of the via-hole conductors B11 is provided in the line portion 18*a*-*b*.

The via-hole conductors B12 are, as illustrated in FIGS. 16 through 20, pierced in the line portions 18*b*-*a*, 18*b*-*c*, 18*b*-*d* and 18*b*-*e* in the z-direction. The via-hole conductors B12 pierced in each of the line portions 18*b*-*a* and 18*b*-*e* are, as seen in FIGS. 16 and 17, aligned in the x-direction in the portion farther in the negative y-direction than the center line L of each of the line portions 12*a* and 12*e* with respect to the y-direction. The via-hole conductors B12 pierced in the line portion 18*b*-*c* are, as illustrated in FIG. 18, aligned in the x-direction in the portion farther in the positive y-direction than the center line L of the line portion 12*c* with respect to the y-direction. The via-hole conductor B12 pierced in the line portion 18*b*-*d* is, as illustrated in FIG. 20, located in the portion farther in the negative x-direction than the center line L of the line portion 12*d* with respect to the x-direction. As seen in FIG. 19, none of the via-hole conductors B12 is provided in the line portion 18*b*-*b*.

The via-hole conductors B11 are connected to the respectively adjacent via-hole conductors B12, and each connected pair of via-hole conductors B11 and B12 defines and serves as one via-hole conductor. Thus, the via-hole conductors B11 and B12 connect the main ground conductor 22 to the connecting portions 70 of the auxiliary ground conductor 24. The via-hole conductors B11 and B12 are formed preferably by filling through holes made in the dielectric sheets 18*a* and 18*b* with a metal material.

The via-hole conductors B13 are, as illustrated in FIGS. 16 through 20, pierced in the line portions 18*a*-*a*, 18*a*-*b*, 18*a*-*c* and 18*a*-*e* in the z-direction. The via-hole conductors B12 pierced in each of the line portions 18*a*-*a* and 18*a*-*e* are, as seen in FIGS. 16 and 17, aligned in the x-direction in the portion farther in the positive y-direction than the center line L of each of the line portions 12*a* and 12*e* with respect to the y-direction. The via-hole conductors B13 pierced in the line portion 18*a*-*c* are, as illustrated in FIG. 18, aligned in the x-direction in the portion farther in the negative y-direction than the center line L of the line portion 12*c* with respect to the y-direction. The via-hole conductor B13 pierced in the line portion 18*a*-*b* is, as illustrated in FIG. 19, located in the portion farther in the positive x-direction than the center line L of the line portion 12*d* with respect to the x-direction. As seen in FIG. 20, none of the via-hole conductors B13 is provided in the line portion 18*a*-*d*.

The via-hole conductors B14 are, as illustrated in FIGS. 16 through 20, pierced in the line portions 18*b*-*a*, 18*b*-*b*, 18*b*-*c* and 18*b*-*e* in the z-direction. The via-hole conductors B14 pierced in each of the line portions 18*b*-*a* and 18*b*-*e* are, as illustrated in FIGS. 16 and 17, aligned in the x-direction in the portion farther in the positive y-direction than the center line L of each of the line portions 12*a* and 12*e* with respect to the y-direction. The via-hole conductors B14 pierced in the line portion 18*b*-*c* are, as illustrated in FIG. 18, aligned in the x-direction in the portion farther in the negative y-direction than the center line L of the line portion 12*c* with respect to the y-direction. The via-hole conductor B14 pierced in the line portion 18*b*-*b* is, as illustrated in FIG. 19, located in the portion farther in the positive x-direction than the center line L of the line portion 12*d* with respect to the x-direction. As seen in FIG. 20, none of the via-hole conductors B14 is provided in the line portion 18*b*-*d*.

The via-hole conductors B13 are connected to the respectively adjacent via-hole conductors B14, and each connected pair of via-hole conductors B13 and B14 defines and serves as one via-hole conductor. Thus, the via-hole conductors B13 and B14 connect the main ground conductor 22 to the connecting portions 72 of the auxiliary ground conductor 24. The via-hole conductors B13 and B14 are formed preferably by filling through holes made in the dielectric sheets 18*a* and 18*b* with a metal material.

In the line portions 12*a*, 12*c* and 12*e* of the high-frequency signal line 10*b*, areas where the connected pairs of via-hole conductors B11 and B12 are respectively located are hereinafter referred to as areas A2. Specifically, the areas A2 in the line portions 12*a*, 12*c* and 12*e* mean the areas extending from the respective pairs of via-hole conductors B11 and B12 to the both sides in the y-direction. In the line portions 12*a*, 12*c* and 12*e* of the high-frequency signal line 10*b*, areas where the connected pairs of via-hole conductors B13 and B14 are respectively located are hereinafter referred to as areas A3. Specifically, the areas A3 in the line portions 12*a*, 12*c* and 12*e* mean the areas extending from the respective pairs of via-hole conductors B13 and B14 to the both sides in the y-direction.

In this regard, in the line portions 12*a*, 12*c* and 12*e*, the pairs of via-hole conductors B11 and B12 are located in different positions in the x-direction from the pairs of via-hole conductors B13 and B14. In this preferred embodiment, the pairs of via-hole conductors B11 and B12 and the pairs of via-hole conductors B13 and B14 are arranged alternately in the x-direction. In this preferred embodiment, each pair of via-hole conductors B11 and B12 is located on the middle point between two adjacent pairs of via-hole conductor B13 and B14 with respect to the x-direction. Also, each pair of via-hole conductors B13 and B14 is located on the middle point between two adjacent pairs of via-hole conductor B11 and B12 with respect to the x-direction.

In the line portions 12*a*, 12*c* and 12*e* of the high-frequency signal line 10*b*, the areas between the areas A2 and A3 are referred to as areas A1. Accordingly, the areas A1 are areas where none of the via-hole conductors B11 through B14 are provided.

As illustrated in FIG. 16 through 20, the signal line 20 preferably is meandering. First, the line conductors 20*a* and 20*e* provided in the line portions 12*a* and 12*e* are described.

The portions of the line conductor 20*a* in the areas A1 are located farther in the negative y-direction than the portions of the line conductor 20*a* in the areas A2, and the portions of the line conductor 20*e* in the areas A1 are located farther in the negative y-direction than the portions of the line conductor 20*e* in the areas A2. The portions of the line conductor 20*a* in the areas A1 are located farther in the positive y-direction than the portions of the line conductor 20*a* in the areas A3, and the portions of the line conductor 20*e* in the areas A1 are located farther in the positive y-direction than the portions of the line conductor 20*e* in the areas A3. Thus, the signal line 20 skirts around the pairs of via-hole conductors B11 and B12 and the pairs of via-hole conductors B13 and B14.

Each of the line conductors 20*a* and 20*e* includes wide portions 50, 52 and 54, and narrow portions 56, 58, 60 and 62. The line widths of the wide portions 50, 52 and 54 are W1, and the line widths of the narrow portions 56, 58, 60 and 62 are W2. The line width W1 is greater than the line width W2. On each of the line portions 18*b*-*a* and 18*b*-*e*, the wide portions 50 are located in the areas A1 to extend in the x-direction on the center line L of each of the line portions 18*b*-*a* and 18*b*-*e* with respect to the y-direction. The wide portions 50 are located over the openings 30 and 32 when viewed from the z-direction. Therefore, the wide portions 50 of the signal line 20 are not overlapped with the auxiliary ground conductor 24 when viewed from the z-direction.

On each of the line portions 18b-a and 18b-e, the wide portions 52 are located in the areas A2 to extend in the x-direction in the portion farther in the positive y-direction than the center line L of each of the line portions 18b-a and 18b-e with respect to the y-direction. The both ends in the x-direction of each of the wide portions 52 protrude to the adjacent areas A1. The wide portions 52 are located over the notches C2 when viewed from the z-direction. Therefore, the wide portions 52 of the signal line 20 are not overlapped with the auxiliary ground conductor 24 when viewed from the z-direction.

On each of the line portions 18b-a and 18b-e, the wide portions 52 are located in the areas A3 to extend in the x-direction in the portion farther in the negative y-direction than the center line L of each of the line portions 18b-a and 18b-e with respect to the y-direction. The both ends in the x-direction of each of the wide portions 54 protrude to the adjacent areas A1. The wide portions 54 are located over the notches C1 when viewed from the z-direction. Therefore, the wide portions 54 of the signal line 20 are not overlapped with the auxiliary ground conductor 24 when viewed from the z-direction. The wide portions 50, 52 and 54 are tapered at the respective both ends.

The narrow portions 56 are located in the areas A1 to connect the respective positive ends in the x-direction of the wide portions 52 to the respective negative ends in the x-direction of the respectively adjacent wide portions 50. The narrow portions 56 are inclined so as to run in the positive x-direction while running in the negative y-direction. The narrow portions 56 are, as illustrated in FIGS. 16 and 17, overlapped with the bridges 78 when viewed from the z-direction.

The narrow portions 58 are located in the areas A1 to connect the respective positive ends in the x-direction of the wide portions 50 to the respective negative ends in the x-direction of the respectively adjacent wide portions 54. The narrow portions 58 are inclined so as to run in the positive x-direction while running in the negative y-direction. The narrow portions 56 are, as illustrated in FIGS. 16 and 17, overlapped with the bridges 80 when viewed from the z-direction.

The narrow portions 60 are located in the areas A1 to connect the respective positive ends in the x-direction of the wide portions 50 to the respective negative ends in the x-direction of the respectively adjacent wide portions 52. The narrow portions 60 are inclined so as to run in the positive x-direction while running in the positive y-direction. The narrow portions 60 are, as illustrated in FIGS. 16 and 17, overlapped with the bridges 88 when viewed from the z-direction.

The narrow portions 62 are located in the areas A1 to connect the respective positive ends in the x-direction of the wide portions 54 to the respective negative ends in the x-direction of the respectively adjacent wide portions 50. The narrow portions 62 are inclined so as to run in the positive x-direction while running in the positive y-direction. The narrow portions 62 are, as illustrated in FIGS. 16 and 17, overlapped with the bridges 86 when viewed from the z-direction.

Next, the line conductor 20c in the line portion 12c is described. The line conductor 20c has a configuration formed by turning the line conductor 20a or 20e by 180 degrees on the z-axis. Here, a detailed description of the line conductor 20c is omitted.

Next, the line conductor 20b in the line portion 12b is described. As seen in FIG. 19, the line conductor 20b skirts around the via-hole conductors B13 and B14. More specifically, the line conductor 20b includes a wide portion 54 and narrow portions 58 and 62. The line width of the wide portion 54 is W1, and the line widths of the narrow portions 58 and 62 are W2. The width W1 is greater than the width W2.

The wide portion 54 is located in the center of the line portion 12b with respect to the y-direction and extends in the y-direction in the portion farther in the negative x-direction than the central line L of the line portion 18b-b with respect to the x-direction. The wide portion 54 is located over the notch C1 when viewed from the z-direction. Therefore, the wide portion 54 is not overlapped with the auxiliary ground conductor 24. The wide portion 54 is tapered at the both ends.

The narrow portion 58 connects the positive end in the y-direction of the wide portion 54 to the positive end in the x-direction of the wide portion 50 located farthest in the positive x-direction in the line portion 12a. The narrow portion 58 is, as illustrated in FIG. 19, overlapped with the bridge 80 when viewed from the z-direction.

The narrow portion 62 connects the negative end in the y-direction of the wide portion 54 to the positive end in the x-direction of the wide portion 50 located farthest in the positive x-direction in the line portion 12c. The narrow portion 62 is, as illustrated in FIG. 19, overlapped with the bridge 86 when viewed from the z-direction.

Next, the line conductor 20d in the line portion 12d is described. As seen in FIG. 20, the line conductor 20d skirts around the via-hole conductors B11 and B12. More specifically, the line conductor 20d includes a wide portion 52 and narrow portions 56 and 60. The line width of the wide portion 52 is W1, and the line widths of the narrow portions 56 and 60 are W2. The width W1 is greater than the width W2.

The wide portion 52 is located in the center of the line portion 12d with respect to the y-direction and extends in the y-direction in the portion farther in the positive x-direction than the central line L of the line portion 18b-d with respect to the x-direction. The wide portion 52 is located over the notch C2 when viewed from the z-direction. Therefore, the wide portion 52 is not overlapped with the auxiliary ground conductor 24 when viewed from the z-direction. The wide portion 52 is tapered at the both ends.

The narrow portion 56 connects the negative end in the y-direction of the wide portion 52 to the negative end in the x-direction of the wide portion 50 located farthest in the negative x-direction in the line portion 12e. The narrow portion 56 is, as illustrated in FIG. 20, overlapped with the bridge 78 when viewed from the z-direction.

The narrow portion 60 connects the positive end in the y-direction of the wide portion 52 to the negative end in the x-direction of the wide portion 50 located farthest in the negative x-direction in the line portion 12c. The narrow portion 60 is, as illustrated in FIG. 20, overlapped with the bridge 88 when viewed from the z-direction.

In the high-frequency signal line 10b having the structure above, damage of the via-hole conductors is reliably prevented as in the high-frequency signal line 10. In the high-frequency signal line 10b, it is not necessary to provide via-hole conductors along the signal line 20 such that two via-hole conductors are on opposite sides of the signal line 20 from each other as in the high-frequency signal line 10. Therefore, it is possible to increase the line width of the signal line, thus reducing the transmission loss. Also, it is not necessary to make the arrangements of the via-hole conductors in the line portions 12b and 12d different from those in the other line portions as in the high-frequency signal line 10. Therefore, the risk that the ground potential in the line portions 12b and 12d may become out of balance compared with the other line portions is diminished.

Third Modification

Next, a high-frequency signal line 10c according to a third modification of a preferred embodiment of the present invention is described with reference to the drawings. FIG. 21 is a plan view from the z-direction of the high-frequency signal line 10c. In FIG. 21, the borders between the line portions 12a through 12e are indicated by dotted lines.

The high-frequency signal line 10c is different from the high-frequency signal line 10 in the structures of the border portion between the line portions 12a through 12c and the border portion between the line portions 12c through 12e. The high-frequency signal line 10c is described with a focus on the difference.

An inner periphery portion defined by the connection of the line portions 12a through 12c is punched, and thus, a circular or substantially circular hole H1 is formed. Similarly, an inner periphery portion defined by the connection of the line portions 12c through 12e is punched, and thus, a circular or substantially circular hole H2 is formed.

In the high-frequency signal line 10c having the structure above, damage of the via-hole conductors B1 through B4 is reliably prevented as in the high-frequency signal line 10.

In the high-frequency signal line 10c, there are no sharp corners in the inner periphery portion defined by the connection of the line portions 12a through 12c. Therefore, even when the line portion 12b is twisted, the line portion 12b is prevented from being damaged by any corner in the inner periphery portion.

Similarly, there are no sharp corners in the inner periphery portion defined by the connection of the line portions 12c through 12e. Therefore, even when the line portion 12d is twisted, the line portion 12d is prevented from being damaged by any corner in the inner periphery portion.

Fourth Modification

Next, a high-frequency signal line 10d according to a fourth modification of a preferred embodiment of the present invention is described with reference to the drawings. FIG. 22 is a plan view from the z-direction of the high-frequency signal line 10d. In FIG. 22, the borders between the line portions 12a through 12e are indicated by dotted lines.

The high-frequency signal line 10d is different from the high-frequency signal line 10c in the positions of the holes H1 and H2. The high-frequency signal line 10d is described with a focus on the difference.

The hole H1 of the high-frequency signal line 10d is located farther in the positive y-direction than the hole H1 of the high-frequency signal line 10c. Thus, in the high-frequency signal line 10d, the hole H1 does not protrude into the line portion 12c and protrudes only into the line portion 12a.

The hole H2 of the high-frequency signal line 10d is located farther in the negative y-direction than the hole H2 of the high-frequency signal line 10c. Thus, in the high-frequency signal line 10d, the hole H2 does not protrude into the line portion 12c and protrudes only into the line portion 12e.

In the high-frequency signal line 10d having the structure above, damage of the via-hole conductors B1 through B4 is reliably prevented as in the high-frequency signal line 10c.

In the high-frequency signal line 10d, there are no sharp corners in the inner periphery portion defined by the connection of the line portions 12a through 12c. Therefore, even when the line portion 12b is twisted, the line portion 12b is prevented from being damaged by any corner in the inner periphery portion.

Similarly, there are no sharp corners in the inner periphery portion defined by the connection of the line portions 12c through 12e. Therefore, even when the line portion 12d is twisted, the line portion 12d is prevented from being damaged by any corner in the inner periphery portion.

In the high-frequency signal line 10d, the holes H1 and H2 do not protrude into the line portion 12c, and the diameters of the holes H1 and H2 of the high-frequency signal line 10d preferably are smaller than the holes H1 and H2 of the high-frequency signal line 10c. Accordingly, the signal line 20, the main ground conductor 22, the auxiliary ground conductor 24 and the via-hole conductors B1 through B4 in the line portion 12c can be designed more freely.

Fifth Modification

Figure 24:
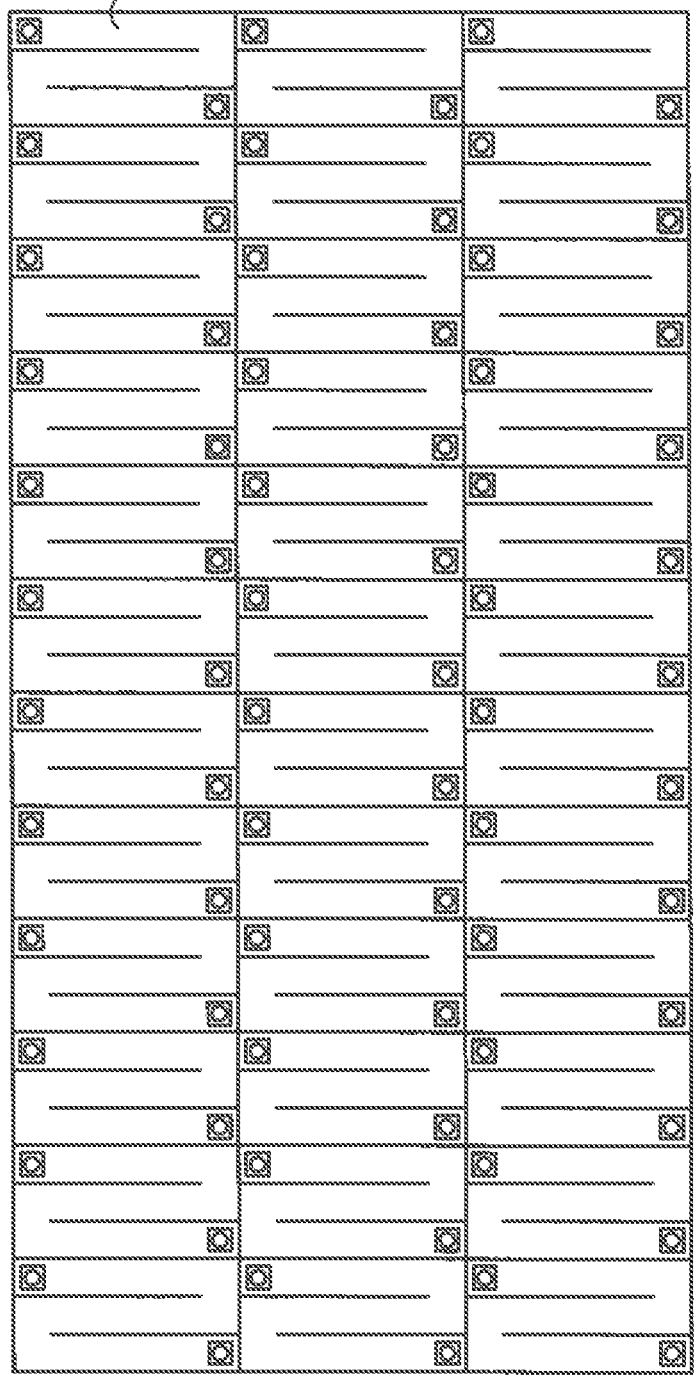
FIG. 24 is a plan view of a mother laminate that is an aggregation of high-frequency signal lines.

Next, a high-frequency signal line 10e according to a fifth modification of a preferred embodiment of the present invention is described with reference to the drawings. FIG. 23 is a plan view from the z-direction of the high-frequency signal line 10e. FIG. 24 is a plan view of a mother laminate 300, which is an aggregation of high-frequency signal lines 10e. In FIG. 23, the borders between the line portions 12a through 12e are indicated by dotted lines.

The high-frequency signal line 10e is different from the high-frequency signal line 10 in that the high-frequency signal line 10e has a rectangular or substantially rectangular outline. The high-frequency signal line 10e is described with a focus on the difference.

The high-frequency signal line 10e includes a cut line C11 extending in the x-direction in a portion farther in the positive y-direction than the center line of the dielectric body 12 with respect to the y-direction. The cut line C11 extends in the positive x-direction from the shorter side of the dielectric body 12 on the negative side in the x-direction. However, the cut line C11 does not reach the shorter side of the dielectric body 12 on the positive side in the x-direction. With the cut line C11, the line portions 12a through 12c are provided.

The high-frequency signal line 10e also includes a cut line C12 extending in the x-direction in a portion farther in the negative y-direction than the center line of the dielectric body 12 with respect to the y-direction. The cut line C12 extends in the negative x-direction from the shorter side of the dielectric body 12 on the positive side in the x-direction. However, the cut line C12 does not reach the shorter side of the dielectric body 12 on the negative side in the x-direction. With the cut line C12, the line portions 12c through 12e are provided.

In the high-frequency signal line 10e having the structure above, damage of the via-hole conductors is reliably prevented as in the high-frequency signal line 10.

The high-frequency signal line 10e preferably is rectangular or substantially rectangular. Therefore, as illustrated in FIG. 24, it is possible to arrange high-frequency signal lines 10e in a matrix on the mother laminate 300 without making any space. Thus, it is possible to obtain more high-frequency signal lines 10e from the mother laminate 300.

Sixth Modification

Next, a high-frequency signal line 10f according to a sixth modification of a preferred embodiment of the present invention is described with reference to the drawings. FIG. 25 is a plan view from the z-direction of the high-frequency signal line 10f. In FIG. 25, the borders between the line portions 12a through 12e are indicated by dotted lines.

The high-frequency signal line 10f is different from the high-frequency signal line 10e in that the high-frequency signal line 10f includes a hole H4 at the positive end in the x-direction of the cut line C11 and includes a hole H5 at the negative end in the x-direction of the cut line C12.

In the high-frequency signal line 10f having the structure above, damage of the via-hole conductors B1 through B4 is reliably prevented as in the high-frequency signal line 10e.

With the hole H4 provided at the positive end in the x-direction of the cut line C11, damage of the line portion 12b due to a twist of the line portion 12b is prevented.

With the hole H5 provided at the positive end in the x-direction of the cut line C12, damage of the line portion 12d due to a twist of the line portion 12d is prevented.

Seventh Modification

Next, a high-frequency signal line 10g according to a seventh modification of a preferred embodiment of the present invention is described with reference to the drawings. FIG. 26 is a plan view from the z-direction of the high-frequency signal line 10g. In FIG. 26, the borders between the line portions 12a through 12e are indicated by dotted lines.

The high-frequency signal line 10g is different from the high-frequency signal line 10e in the shapes of the cut lines C11 and C12. The high-frequency signal line 10g is described with a focus on the difference.

In the high-frequency signal line 10g, the cut lines C11 and C12 preferably are L-shaped or substantially L-shaped. More specifically, the cut line C11 extends in the positive y-direction from a point on the negative side in the y-direction of the laminate body 12 and near the corner between the negative side in the y-direction and the negative side in the x-direction, and thereafter bends to the positive side in the x-direction. The dielectric body 12 is punched such that a space is provided between the line portions 12a and 12c.

The cut line C12 extends in the negative y-direction from a point on the positive side in the y-direction of the laminate body 12 and near the corner between the positive side in the y-direction and the positive side in the x-direction, and thereafter bends to the negative side in the x-direction. The dielectric body 12 is punched such that a space is provided between the line portions 12c and 12e.

In the high-frequency signal line 10g, damage of the via-hole conductors B1 through B4 is reliably prevented as in the high-frequency signal line 10e.

Eighth Modification

Figure 27:
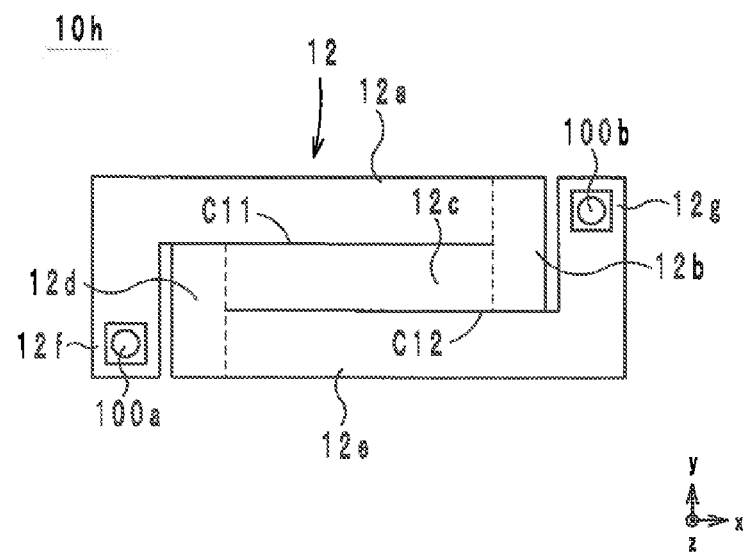
FIG. 27 is a plan view from the z-direction of a high-frequency signal line according to an eighth modification of a preferred embodiment of the present invention.

Next, a high-frequency signal line 10h according to an eighth modification of a preferred embodiment of the present invention is described with reference to the drawings. In FIG. 27, the borders between the line portions 12a through 12e are indicated by dotted lines.

The high-frequency signal line 10h is different from the high-frequency signal line 10g in that the high-frequency signal line 10h has a space between the connecting portion 12f and the line portion 12d and a space between the connecting portion 12g and the line portion 12b.

In the high-frequency signal line 10h having the structure above, damage of the via-hole conductors B1 through B4 is reliably prevented as in the high-frequency signal line 10g.

Ninth Modification

Figure 28:
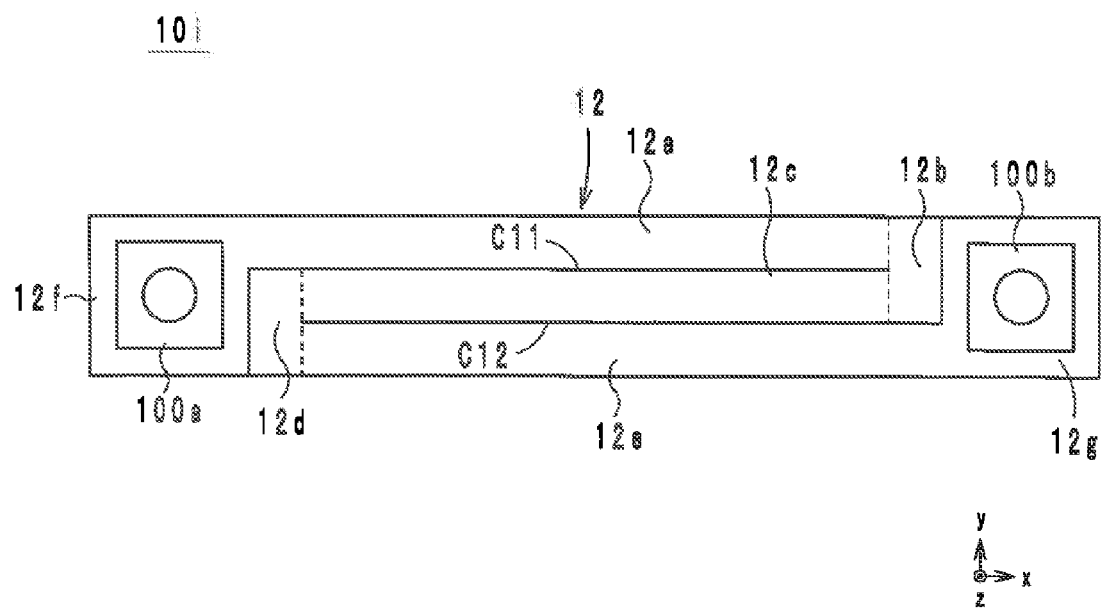
FIG. 28 is a plan view from the z-direction of a high-frequency signal line according to a ninth modification of a preferred embodiment of the present invention.

Next, a high-frequency signal line 10i according to a ninth modification of a preferred embodiment of the present invention is described with reference to the drawings. FIG. 28 is a plan view from the z-direction of the high-frequency signal line 10i. In FIG. 28, the borders between the line portions 12a through 12e are indicated by dotted lines.

The high-frequency signal line 10i is different from the high-frequency signal line 10h in length (size in the x-direction). Specifically, the length (size in the x-direction) of the high-frequency signal line 10h is greater than the length (size in the x-direction) of the high-frequency signal line 10i.

In the high-frequency signal line 10i having the structure above, damage of the via-hole conductors B1 through B4 is reliably prevented as in the high-frequency signal line 10g.

Tenth Modification

Next, a high-frequency signal line 10j according to a tenth modification of a preferred embodiment of the present invention is described with reference to the drawings. FIG. 29A is a plan view from the z-direction of the line portions 12a through 12c of the high-frequency signal line 10j according to the tenth modification. FIG. 29B is a plan view of the line portions 12c through 12e of the high-frequency signal line 10j according to the tenth modification when viewed from the z-direction.

The high-frequency signal line 10j is different from the high-frequency signal line 10a in the intervals of the via-hole conductors. The high-frequency signal line 10j is described with a focus on the difference.

As indicated in FIG. 29A, among the via-hole conductors provided in the line portion 12a, the ones located closest to the positive end in the x-direction of the line portion 12a are referred to as via-hole conductors Ba. Also, among the via-hole conductors provided in the line portion 12c, the ones located closest to the positive end in the x-direction are referred to as via-hole conductors Bb. The portion of the signal line 20 closest to the via-hole conductors Ba is referred to as a portion Pa, and the portion of the signal line 20 closest to the via-hole conductors Bb is referred to as a portion Pb. The length La of the signal line 20 between the portions Pa and Pb preferably is not more than about one half wavelength of a high-frequency signal to be transmitted through the signal line 20, and more preferably not more than about one quarter wavelength of the high-frequency signal, for example. For example, when the frequency of the high-frequency signal is 2 GHz, the length La of the signal line 20 between the portions Pa and Pb preferably is designed to be not more than about 0.0375 mm, which is about one quarter wavelength of the high-frequency signal.

As indicated in FIG. 29B, among the via-hole conductors provided in the line portion 12c, the ones located closest to the negative end in the x-direction of the line portion 12c are referred to as via-hole conductors Bc. Also, among the via-hole conductors provided in the line portion 12e, the ones located closest to the negative end in the x-direction of the line portion 12e are referred to as via-hole conductors Bd. The portion of the signal line 20 closest to the via-hole conductors Bc is referred to as a portion Pc, and the portion of the signal line 20 closest to the via-hole conductors Bd is referred to as a portion Pd. The length Lb of the signal line 20 between the portions Pc and Pd preferably is not more than about one half wavelength of a high-frequency signal to be transmitted through the signal line 20, and more preferably not more than about one quarter wavelength of the high-frequency signal, for example. For example, when the frequency of the high-frequency signal is 2 GHz, the length Lb of the signal line 20 between the portions Pc and Pd preferably is designed to be not more than about 0.0375 mm, for example, which is about one quarter wavelength of the high-frequency signal.

In the high-frequency signal line 10j having the structure above, damage of the via-hole conductors is reliably prevented as in the high-frequency signal line 10a.

Also, it is possible to significantly diminish or prevent noise radiation from the line portions 12b, 12d and the neighboring portions of the high-frequency signal line 10j in the x-direction and y-direction. This is described in connection with the line portion 12b as an example. As seen in FIG. 29A, the via-hole conductors Ba are located near the portion Pa of the signal line 20, and the via-hole conductors Bb are located near the portion Pb of the signal line 20. Therefore, capacitance is created between the via-hole conductors Ba and the portion Pa and between the via-hole conductors Bb and the portion Pb. Accordingly, the characteristic impedance of the signal line 20 at the portions Pa and Pb is lower than the characteristic impedance of the signal line 20 in the portion between the portions Pa and Pb. Thus, reflection of a high-frequency signal occurs between the portions Pa and Pb, and a standing wave having anti-nodes at the portions Pa and Pb occurs between the portions Pa and Pb. Such standing waves may cause noise.

In the high-frequency signal line 10j, the length La of the signal line 20 between the portions Pa and Pb preferably is not more than about one half wavelength of a high-frequency signal to be transmitted through the signal line 20, for example. This prevents the occurrence of standing waves between the portions Pa and Pb. Consequently, noise radiation from the line portion 12b in the x-direction and y-direction is prevented. For the same reason, noise radiation from the line portion 12d in the x-direction and y-direction is prevented.

In the high-frequency signal line 10j, noise is prevented from being mixed into a high-frequency signal transmitted through the signal line 20 through the line portions 12b, 12d and the neighboring portions. This is described in connection with the line portion 12b and the neighboring portions as an example.

The signal line 20 is sandwiched between the main ground conductor 22 and the auxiliary ground conductor 24 from the both sides in the z-direction, and therefore, noise radiation from the signal line 20 in the z-direction is prevented. On the sides in the x-direction and on the sides in the y-direction of the signal line 20, however, only the via-hole conductors are present. Therefore, noise is likely to be radiated from the signal line 20 in the x-direction and y-direction.

Around the border between the line portions 12a and 12b, the line conductor 20a provided in the line portion 12a and the line conductor 12b provided in the line portion 12b are close to each other. Therefore, as indicated by arrows M in FIG. 29A, when noise is radiated from the line conductor 12a in the x-direction and y-direction, the noise may be mixed into a high-frequency signal transmitted through the line conductor 12b, and similarly, when noise is radiated from the line conductor 12b in the x-direction and y-direction, the noise may be mixed into a high-frequency signal transmitted through the line conductor 12a. Thus, there is a risk that the line portions 12a and 12b may be electromagnetically coupled with each other, thus causing a transmission loss.

In view of this fact, in the high-frequency signal line 10j, the length La of the signal line 20 between the portions Pa and Pb is not more than about one quarter wavelength of the wavelength of a high-frequency signal to be transmitted through the signal line 20, for example. With this arrangement, standing waves with a frequency not more than double the frequency of the high-frequency signal to be transmitted through the signal line 20 is prevented from occurring between the portions Pa and Pb. For example, when a high-frequency signal with a frequency of 2 GHz is transmitted through the signal line 20, the occurrence of standing waves with a frequency not more than 4 GHz is prevented. In a case where a high-frequency signal with a frequency of 2 GHz is transmitted through the signal line 20, generally, a high-frequency signal with a bandwidth from 1 GHz to 3 GHz is transmitted through the signal line 20. Therefore, the fact that the occurrence of standing waves with a frequency not more than 4 GHz is prevented means that the occurrence of noise with a frequency within the bandwidth of the high-frequency signal transmitted through the signal line 20 is prevented. Consequently, in the high-frequency signal line 10j, noise is prevented from being mixed into the high-frequency signal transmitted through the signal line 20 through the line portion 12b and the neighboring portions. For the same reason, noise is prevented from being mixed into the high-frequency signal transmitted through the signal line 20 through the line portion 12d and the neighboring portions.

Eleventh Modification

Figure 30A:
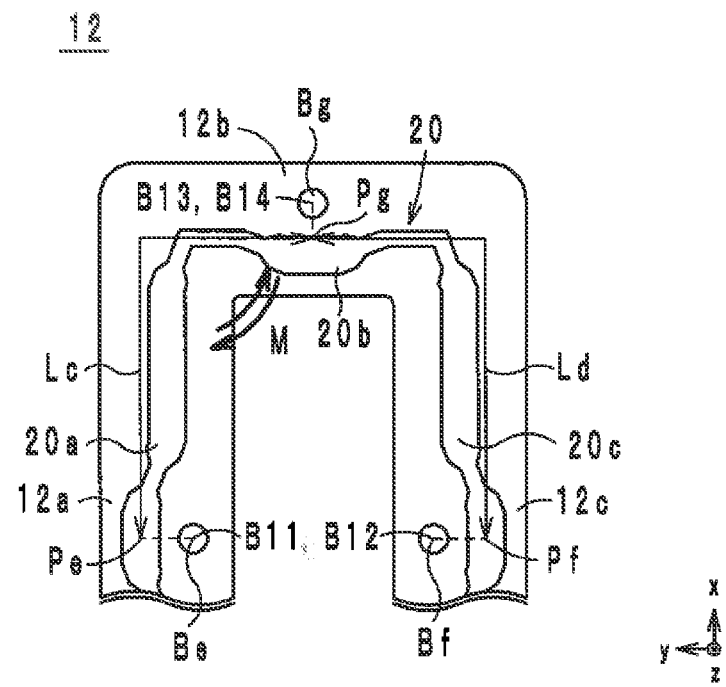
FIG. 30A is a plan view from the z-direction of a high-frequency signal line according to an eleventh modification of a preferred embodiment of the present invention.
Figure 30B:
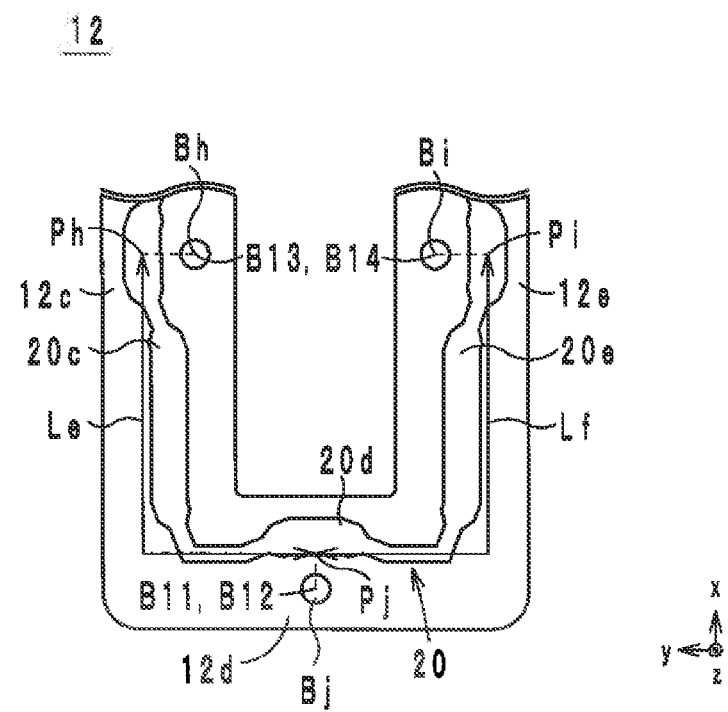
FIG. 30B is a plan view from the z-direction of the high-frequency signal line according to the eleventh modification of a preferred embodiment of the present invention.

Next, a high-frequency signal line 10k according to an eleventh modification of a preferred embodiment of the present invention is described with reference to the drawings. FIG. 30A is a plan view from the z-direction of the line portions 12a through 12c of the high-frequency signal line 10k according to the eleventh modification. FIG. 30B is a plan view of the signal line 12c through 12e of the high-frequency signal line 10k according to the eleventh modification when viewed from the z-direction.

The high-frequency signal line 10k is different from the high-frequency signal line 10b in the intervals between the via-hole conductors. The high-frequency signal line 10k is described with a focus on the difference.

As indicated in FIG. 30A, among the via-hole conductors provided in the line portion 12a, the one located closest to the positive end in the x-direction of the line portion 12a is referred to as a via-hole conductor Be. Among the via-hole conductors provided in the line portion 12c, the one located closest to the positive end in the x-direction of the line portion 12c is referred to as a via-hole conductor Bf. Among the via-hole conductors provided in the line portion 12b, the one located closest to the line portion 12a is referred to as a via-hole conductor Bg. The via-hole conductor Bg is the only via-hole conductor provided in the line portion 12b. Therefore, the via-hole conductor Bg is also the via-hole conductor located closest to the line portion 12c among the via-hole conductors provided in the line portion 12b.

The portion of the signal line 20 closest to the via-hole conductor Be is referred to as a portion Pe, and the portion of the signal line 20 closest to the via-hole conductor Bf is referred to as a portion Pf. The portion of the signal line 20 closest to the via-hole conductor Bg is referred to as a portion Pg. The length Lc of the signal line 20 between the portions Pe and Pf preferably is not more than about one half wavelength of a high-frequency signal to be transmitted through the signal line 20, and more preferably not more than about one quarter wavelength of the high-frequency signal, for example. Similarly, the length Ld of the signal line 20 between the portions Pf and Pg preferably is not more than about one half wavelength of the high-frequency signal to be transmitted through the signal line 20, and more preferably not more than about one quarter wavelength of the high-frequency signal, for example.

As indicated in FIG. 30B, among the via-hole conductors provided in the line portion 12c, the one located closest to the negative end in the x-direction of the line portion 12c is referred to as a via-hole conductor Bh. Among the via-hole conductors provided in the line portion 12e, the one located closest to the negative end in the x-direction of the line portion 12e is referred to as a via-hole conductor Bi. Among the via-hole conductors provided in the line portion 12d, the one located closest to the line portion 12c is referred to as a via-hole conductor Bj. The via-hole conductor Bj is the only via-hole conductor provided in the line portion 12d. Therefore, the via-hole conductor Bj is also the via-hole conductor located closest to the line portion 12e among the via-hole conductors provided in the line portion 12d.

The portion of the signal line 20 closest to the via-hole conductor Bh is referred to as a portion Ph, and the portion of the signal line 20 closest to the via-hole conductor Bi is referred to as a portion Pi. The portion of the signal line 20 closest to the via-hole conductor Bj is referred to as a portion Pj. The length Le of the signal line 20 between the portions Ph and Pj preferably is not more than about one half wavelength of a high-frequency signal to be transmitted through the signal line 20, and more preferably not more than about one quarter wavelength of the high-frequency signal. Similarly, the length Lf of the signal line 20 between the portions Pi and Pj preferably is not more than about one half wavelength of the high-frequency signal to be transmitted through the signal line 20, and more preferably not more than about one quarter wavelength of the high-frequency signal.

In the high-frequency signal line 10k having the structure above, damage of the via-hole conductors is prevented effectively as in the high-frequency signal line 10b.

Also, it is possible to prevent noise radiation from the high-frequency signal line 10k through the line portions 12b and 12d and the neighboring portions. This is described in connection with the line portion 12b as an example. As seen in FIG. 30A, the via-hole conductor Be is located near the portion Pe of the signal line 20, and the via-hole conductor Bg is located near the portion Pg of the signal line 20. Therefore, capacitance is generated between the via-hole conductor Be and the portion Pe and between the via-hole conductor Bg and the portion Pg. Accordingly, the characteristic impedance of the signal line 20 at the portions Pe and Pg is lower than the characteristic impedance of the signal line 20 in the portion between the portions Pe and Pg. Thus, reflection of a high-frequency signal occurs between the portions Pe and Pg, and standing waves having anti-nodes at the portions Pe and Pg occurs between the portions Pe and Pg. Such standing waves may cause noise.

In view of the fact, in the high-frequency signal line 10k, the length Lc of the signal line 20 between the portions Pe and Pg preferably is not more than about one half wavelength of a high-frequency signal to be transmitted through the signal line 20, for example. This prevents the occurrence of standing waves between the portions Pe and Pg. For the same reason, the occurrence of standing waves between the portions Pf and Pg is prevented. Consequently, noise radiation from the line portion 12b and the neighboring portions in the x-direction and y-direction is prevented. Similarly, noise radiation from the line portion 12d and the neighboring portions in the x-direction and y-direction is prevented.

In the high-frequency signal line 10k, it is also prevented that noise is mixed into a high-frequency signal transmitted through the signal line 20 through the line portions 12b, 12d and the neighboring portions. This is described in connection with the line portion 12b and the neighboring portions as an example.

The signal line 20 is sandwiched between the main ground conductor 22 and the auxiliary ground conductor 24 from the both sides in the z-direction, and therefore, noise radiation from the signal line 20 in the z-direction is prevented. On the sides in the x-direction and on the sides in the y-direction of the signal line 20, however, only the via-hole conductors are present. Therefore, noise is likely to be radiated from the signal line 20 in the x-direction and y-direction.

Around the border between the line portions 12a and 12b, the line conductor 20a provided in the line portion 12a and the line conductor 12b provided in the line portion 12b are close to each other. Therefore, as indicated by arrows M in FIG. 30A, when noise is radiated from the line conductor 12a in the x-direction and y-direction, the noise may be mixed into a high-frequency signal transmitted through the line conductor 12b, and similarly, when noise is radiated from the line conductor 12b in the x-direction and y-direction, the noise may be mixed into a high-frequency signal transmitted through the line conductor 12a. Thus, there is a risk that the line portions 12a and 12b may be electromagnetically coupled with each other, thus causing a transmission loss.

In view of this fact, in the high-frequency signal line 10k, the length Lc of the signal line 20 between the portions Pe and Pg preferably is not more than about one quarter wavelength of the wavelength of a high-frequency signal to be transmitted through the signal line 20, for example. With this arrangement, standing waves with a frequency not more than double the frequency of the high-frequency signal to be transmitted through the signal line 20 is prevented from occurring between the portions Pe and Pg. For example, when a high-frequency signal with a frequency of 2 GHz is transmitted through the signal line 20, the occurrence of standing waves with a frequency not more than 4 GHz is prevented. In a case where a high-frequency signal with a frequency of 2 GHz is transmitted through the signal line 20, generally, a high-frequency signal with a bandwidth from 1 GHz to 3 GHz is transmitted through the signal line 20. Therefore, the fact that the occurrence of standing waves with a frequency not more than 4 GHz is prevented means that the occurrence of noise with a frequency within the bandwidth of the high-frequency signal transmitted through the signal line 20 is prevented. Consequently, in the high-frequency signal line 10k, noise is prevented from being mixed into a high-frequency signal transmitted through the signal line 20 through the line portion 12b and the neighboring portions. For the same reason, noise is prevented from being mixed into the high-frequency signal transmitted through the signal line 20 through the line portion 12d and the neighboring portions.

It is possible to provide a plurality of via-hole conductors B13 and B14 in the line portion 12b. Similarly, it is possible to provide a plurality of via-hole conductors B11 and B12 in the line portion 12d.

Other Preferred Embodiments

High-frequency signal lines according to the present invention are not limited to the high-frequency signal lines 10, 10a through 10k above, and various changes are possible within the scope of the present invention.

It is possible to combine the structural elements or arrangements of the high-frequency signal lines 10, 10a through 10k.

In the preferred embodiments and modifications described above, the protective layer 14 preferably is formed by screen printing, for example. However, the protective layer 14 may be formed by photolithography, for example.

The connectors 100a and 100b are not indispensable for the high-frequency signal lines 10 and 10a through 10k. In a case where the connectors 100a and 100b are not provided, both ends of each of the high-frequency signal lines 10 and 10a through 10k are connected to circuit boards by solder or the like. It is also possible that only the connector 100a is provided at only one end of each of the high-frequency signal lines 10 and 10a through 10k.

Instead of the via-hole conductors, through-hole conductors may be used. A through-hole conductor is an interlayer connection conductor obtained by forming a conductor, by plating or the like, on the inner surface of a through hole provided in the dielectric body 12.

The openings 30 are not necessarily provided in the auxiliary ground conductor 24.

It is not necessary that the via-hole conductors B1 through B4 are provided in all of the line portions 12a, 12b and 12e, and the via-hole conductors may be provided in at least one of the line portions 12a, 12b and 12e. However, for the purpose of stabilizing the ground potential, the via-hole conductors B1 through B4 are provided preferably in all of the line portions 12a, 12b and 12e.

Each of the high-frequency signal lines 10, 10a through 10k may be used as a high-frequency signal line in an RF circuit board such as an antenna front-end module.

As thus far described, various preferred embodiments of the present invention and modifications thereof are useful in a high-frequency signal line and an electronic device including the same, and various preferred embodiments of the present invention and modifications thereof provide the advantage of preventing damage of interlayer connection conductors.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency signal line comprising:
   a dielectric body including flexible dielectric sheets laminated on each other in a lamination direction, the dielectric body including a first line portion extending in a specified direction, a second line portion extending along the first line portion, and a third line portion connecting an end of the first line portion in the specified direction and an end of the second line portion in the specified direction to each other, the third line portion being shorter than the first and second line portions;
   a signal line extending along the first line portion, the second line portion and the third line portion;
   a first ground conductor located in a portion of the dielectric body on one side in the lamination direction relative to the signal line so as to face the signal line;
   a second ground conductor located in a portion of the dielectric body on another side in the lamination direction relative to the signal line so as to face the signal line; and
   at least one interlayer connection conductor pierced in the dielectric sheets to connect the first ground conductor and the second ground conductor to each other; wherein
   the at least one of the interlayer connection conductor is provided in at least one of the first line portion and the second line portion; and
   none of the at least one interlayer connection conductor is provided in a portion of the third line portion that is farther in a direction opposite to the specified direction than the signal line when viewed from the direction of lamination.

2. A high-frequency signal line according to claim 1, wherein none of the at least one interlayer connection conductor is provided in the third line portion.

3. A high-frequency signal line according to claim 2, wherein
   one of the at least one interlayer connection conductor provided in the first line portion that is located closest to an end of the first line portion in the specified direction is defined as a first interlayer connection conductor, and one of the at least one interlayer connection conductor provided in the second line portion that is located closest to an end of the second line portion in the specified direction is defined as a second interlayer connection conductor; and
   a length of the signal line between a first portion of the signal line that is located closest to the first interlayer connection conductor and a second portion of the signal line that is located closest to the second interlayer connection conductor is not more than about one quarter wavelength of electromagnetic waves to be transmitted through the signal line.

4. A high-frequency signal line according to claim 1, wherein
   the dielectric body includes a fourth line portion extending along the second line portion on an opposite side of the second line portion from the first line portion, and a fifth line portion connecting an end of the second line portion in the direction opposite to the specified direction and an end of the fourth line portion in the direction opposite to the specified direction to each other, the fifth line portion being shorter than the second and fourth line portions; and
   none of the at least one interlayer connection conductor is provided in a portion of the fifth line portion that is farther in the specified direction than the signal line when viewed from the direction of lamination.

5. A high-frequency signal line according to claim 4, wherein
   none of the at least one interlayer connection conductor is provided in the fifth line portion;

one of the at least one interlayer connection conductor provided in the second line portion that is located closest to an end of the second line portion in the direction opposite to the specified direction is defined as a third interlayer connection conductor, and one of the at least one interlayer connection conductor provided in the fourth line portion that is located closest to an end of the fourth line portion in the direction opposite to the specified direction is defined as a fourth interlayer connection conductor; and a length of the signal line between a third portion of the signal line that is located closest to the third interlayer connection conductor and a fourth portion of the signal line that is located closest to the fourth interlayer connection conductor is not more than about one quarter wavelength of electromagnetic waves to be transmitted through the signal line.

6. A high-frequency signal line according to claim 4, wherein the first line portion is pulled in the direction opposite to the specified direction, and the fifth line portion is pulled in the specified direction.

7. A high-frequency signal line according to claim 1, wherein the at least one interlayer connection conductor includes a plurality of interlayer connection conductors provided in the first, second and third line portions;

one of the interlayer connection conductors provided in the first line portion that is located closest to an end of the first line portion in the specified direction is defined as a fifth interlayer connection conductor, and one of the interlayer connection conductors provided in the third line portion that is located closest to the first line portion is defined as a sixth interlayer connection conductor; and a length of the signal line between a fifth portion of the signal line that is located closest to the fifth interlayer connection conductor and a sixth portion of the signal line that is located closest to the sixth interlayer connection conductor is not more than about one quarter wavelength of electromagnetic waves to be transmitted through the signal line.

8. A high-frequency signal line according to claim 7, wherein one of the at least one interlayer connection conductor provided in the second line portion that is located closest to an end of the second line portion in the specified direction is defined as a seventh interlayer connection conductor, and one of the at least one interlayer connection conductor provided in the third line portion that is located closest to the second line portion is defined as an eighth interlayer connection conductor; and a length of the signal line between a seventh portion of the signal line that is located closest to the seventh interlayer connection conductor and an eighth portion of the signal line that is located closest to the eighth interlayer connection conductor is not more than about one quarter wavelength of electromagnetic waves to be transmitted through the signal line.

9. A high-frequency signal line according to claim 7, wherein the dielectric body includes a fourth line portion extending along the second line portion on an opposite side of the second line portion from the first line portion, and a fifth line portion connecting an end of the second line portion in the direction opposite to the specified direction and an end of the fourth line portion in the direction opposite to the specified direction to each other, the fifth line portion being shorter than the second and fourth line portions;

none of the at least one interlayer connection conductor is provided in a portion of the fifth line portion that is farther in the specified direction than the signal line when viewed from the direction of lamination;

the at least one interlay connection conductor including a plurality of interlayer connection conductors provided in the second, fourth and fifth line portions;

one of the interlayer connection conductors provided in the second line portion that is located closest to an end of the second line portion in the direction opposite to the specified direction is defined as a ninth interlayer connection conductor, and one of the interlayer connection conductors provided in the fifth line portion that is located closest to the second line portion is defined as a tenth interlayer connection conductor; and a length of the signal line between a ninth portion of the signal line that is located closest to the ninth interlayer connection conductor and a tenth portion of the signal line that is located closest to the tenth interlayer connection conductor is not more than about one quarter wavelength of electromagnetic waves to be transmitted through the signal line.

10. A high-frequency signal line according to claim 9, wherein one of the at least one interlayer connection conductor provided in the fourth line portion that is located closest to an end of the second line portion in the direction opposite to the specified direction is defined as an eleventh interlayer connection conductor, and one of the at least one interlayer connection conductor provided in the fifth line portion that is located closest to the fourth line portion is defined as a twelfth interlayer connection conductor; and a length of the signal line between an eleventh portion of the signal line that is located closest to the eleventh interlayer connection conductor and a twelfth portion of the signal line that is located closest to the twelfth interlayer connection conductor is not more than about one quarter wavelength of electromagnetic waves to be transmitted through the signal line.

11. An electronic device comprising:

a case; and a high-frequency signal line housed in the case; wherein the high-frequency signal line includes:

a dielectric body including flexible dielectric sheets laminated on each other in a lamination direction, the dielectric body including a first line portion extending in a specified direction, a second line portion extending along the first line portion, and a third line portion connecting an end of the first line portion in the specified direction and an end of the second line portion in the specified direction to each other, the third line portion being shorter than the first and second line portions;

a signal line extending along the first line portion, the second line portion and the third line portion;

a first ground conductor located in a portion of the dielectric body on one side in the lamination direction relative to the signal line so as to face the signal line;

a second ground conductor located in a portion of the dielectric body on another side in the lamination direction relative to the signal line so as to face the signal line; and at least one interlayer connection conductor pierced in the dielectric sheets to connect the first ground conductor and the second ground conductor to each other; wherein the at least one interlayer connection conductor is provided in at least one of the first line portion and the second line portion; and none of the at least one interlayer connection conductor is provided in a portion of the third line portion that is farther in a direction opposite to the specified direction than the signal line when viewed from the direction of lamination.

12. An electronic device according to claim 11, wherein none of the at least one interlayer connection conductor is provided in the third line portion.

13. An electronic device according to claim 12, wherein one of the at least one interlayer connection conductor provided in the first line portion that is located closest to an end of the first line portion in the specified direction is defined as a first interlayer connection conductor, and one of the at least one interlayer connection conductor provided in the second line portion that is located closest to an end of the second line portion in the specified direction is defined as a second interlayer connection conductor; and a length of the signal line between a first portion of the signal line that is located closest to the first interlayer connection conductor and a second portion of the signal line that is located closest to the second interlayer connection conductor is not more than about one quarter wavelength of electromagnetic waves to be transmitted through the signal line.

14. An electronic device according to claim 11, wherein the dielectric body includes a fourth line portion extending along the second line portion on an opposite side of the second line portion from the first line portion, and a fifth line portion connecting an end of the second line portion in the direction opposite to the specified direction and an end of the fourth line portion in the direction opposite to the specified direction to each other, the fifth line portion being shorter than the second and fourth line portions; and none of the at least one interlayer connection conductor is provided in a portion of the fifth line portion that is farther in the specified direction than the signal line when viewed from the direction of lamination.

15. An electronic device according to claim 14, wherein none of the at least one interlayer connection conductor is provided in the fifth line portion;

one of the at least one interlayer connection conductor provided in the second line portion that is located closest to an end of the second line portion in the direction opposite to the specified direction is defined as a third interlayer connection conductor, and one of the at least one interlayer connection conductor provided in the fourth line portion that is located closest to an end of the fourth line portion in the direction opposite to the specified direction is defined as a fourth interlayer connection conductor; and a length of the signal line between a third portion of the signal line that is located closest to the third interlayer connection conductor and a fourth portion of the signal line that is located closest to the fourth interlayer connection conductor is not more than about one quarter wavelength of electromagnetic waves to be transmitted through the signal line.

16. An electronic device according to claim 14, wherein the first line portion is pulled in the direction opposite to the specified direction, and the fifth line portion is pulled in the specified direction.

17. An electronic device according to claim 11, wherein the at least one interlayer connection conductor includes a plurality of interlayer connection conductors provided in the first, second and third line portions;

one of the interlayer connection conductors provided in the first line portion that is located closest to an end of the first line portion in the specified direction is defined as a fifth interlayer connection conductor, and one of the interlayer connection conductors provided in the third line portion that is located closest to the first line portion is defined as a sixth interlayer connection conductor; and a length of the signal line between a fifth portion of the signal line that is located closest to the fifth interlayer connection conductor and a sixth portion of the signal line that is located closest to the sixth interlayer connection conductor is not more than about one quarter wavelength of electromagnetic waves to be transmitted through the signal line.

18. An electronic device according to claim 17, wherein one of the at least one interlayer connection conductor provided in the second line portion that is located closest to an end of the second line portion in the specified direction is defined as a seventh interlayer connection conductor, and one of the at least one interlayer connection conductor provided in the third line portion that is located closest to the second line portion is defined as an eighth interlayer connection conductor; and a length of the signal line between a seventh portion of the signal line that is located closest to the seventh interlayer connection conductor and an eighth portion of the signal line that is located closest to the eighth interlayer connection conductor is not more than about one quarter wavelength of electromagnetic waves to be transmitted through the signal line.

19. An electronic device according to claim 17, wherein the dielectric body includes a fourth line portion extending along the second line portion on an opposite side of the second line portion from the first line portion, and a fifth line portion connecting an end of the second line portion in the direction opposite to the specified direction and an end of the fourth line portion in the direction opposite to the specified direction to each other, the fifth line portion being shorter than the second and fourth line portions;

none of the at least one interlayer connection conductor is provided in a portion of the fifth line portion that is farther in the specified direction than the signal line when viewed from the direction of lamination;

the at least one interlay connection conductor including a plurality of interlayer connection conductors provided in the second, fourth and fifth line portions;

one of the interlayer connection conductors provided in the second line portion that is located closest to an end of the second line portion in the direction opposite to the specified direction is defined as a ninth interlayer connection conductor, and one of the interlayer connection conductors provided in the fifth line portion that is located closest to the second line portion is defined as a tenth interlayer connection conductor; and a length of the signal line between a ninth portion of the signal line that is located closest to the ninth interlayer connection conductor and a tenth portion of the signal line that is located closest to the tenth interlayer connection conductor is not more than about one quarter wavelength of electromagnetic waves to be transmitted through the signal line.

20. An electronic device according to claim 19, wherein one of the at least one interlayer connection conductor provided in the fourth line portion that is located closest to an end of the second line portion in the direction opposite to the specified direction is defined as an eleventh interlayer connection conductor, and one of the at least one interlayer connection conductor provided in the fifth line portion that is located closest to the fourth line portion is defined as a twelfth interlayer connection conductor; and a length of the signal line between an eleventh portion of the signal line that is located closest to the eleventh interlayer connection conductor and a twelfth portion of the signal line that is located closest to the twelfth interlayer connection conductor is not more than about one quarter wavelength of electromagnetic waves to be transmitted through the signal line.

* * * * *